United States Patent
Nakamura

(10) Patent No.: US 10,773,326 B2
(45) Date of Patent: Sep. 15, 2020

(54) PRINTING DEVICE, SOLDER MANAGEMENT SYSTEM, AND PRINTING MANAGING METHOD

(71) Applicant: Panasonic Intellectual Property Management Co., Ltd., Osaka (JP)

(72) Inventor: Yuji Nakamura, Yamanashi (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 559 days.

(21) Appl. No.: 15/490,001

(22) Filed: Apr. 18, 2017

(65) Prior Publication Data
US 2017/0348786 A1 Dec. 7, 2017

(30) Foreign Application Priority Data
Jun. 1, 2016 (JP) .................................. 2016-109771

(51) Int. Cl.
| | |
|---|---|
| B23K 3/00 | (2006.01) |
| B23K 3/06 | (2006.01) |
| B41F 15/08 | (2006.01) |
| B41F 33/16 | (2006.01) |
| B41F 15/42 | (2006.01) |
| H05K 3/12 | (2006.01) |

(Continued)

(52) U.S. Cl.
CPC .......... *B23K 3/0638* (2013.01); *B23K 1/0016* (2013.01); *B41F 15/08* (2013.01); *B41F 15/0881* (2013.01); *B41F 15/423* (2013.01); *B41F 15/44* (2013.01); *B41F 33/16* (2013.01); *H05K 3/1233* (2013.01); *H05K 3/3478* (2013.01); *H05K 3/3494* (2013.01); *B23K 2101/42* (2018.08); *H05K 2203/0139* (2013.01); *H05K 2203/0186* (2013.01); *H05K 2203/163* (2013.01)

(58) Field of Classification Search
CPC ...... B23K 3/0638; B23K 1/0016; B23K 3/08; B23K 3/087; H05K 2203/163; H05K 2203/0139; H05K 3/1216
See application file for complete search history.

(56) References Cited

U.S. PATENT DOCUMENTS

| | | | |
|---|---|---|---|
| 9,332,681 B2 * | 5/2016 | Mantani | H05K 13/0465 |
| 9,352,409 B2 * | 5/2016 | Kuroda | B23K 3/0638 |

(Continued)

FOREIGN PATENT DOCUMENTS

JP 5292163 B2 9/2013

*Primary Examiner* — Erin B Saad
(74) *Attorney, Agent, or Firm* — Pearne & Gordon LLP

(57) ABSTRACT

A printing device includes a storage that stores allowable time for which use of solder supplied to a screen mask can be allowed, a timer that measures time for which the solder is supplied to the screen mask, a determination unit that determines whether or not the solder supplied to the screen mask has exceeded the allowable time based on time measured by the timer, and a notifier that notifies a worker in a case where the determination unit determines that the solder supplied to the screen mask has exceeded the allowable time. The timer measures time by weighting a measurement interval of time for which the solder is moved on the screen mask by a squeegee so as to become greater than a measurement interval of time for which the solder does not move on the screen mask.

14 Claims, 19 Drawing Sheets

(51) Int. Cl.
  *B23K 1/00* (2006.01)
  *B41F 15/44* (2006.01)
  *H05K 3/34* (2006.01)
  *B23K 101/42* (2006.01)

(56) References Cited

U.S. PATENT DOCUMENTS

| | | | |
|---|---|---|---|
| 9,420,702 B2* | 8/2016 | Murakami | H05K 3/341 |
| 9,711,483 B2* | 7/2017 | Wada | H05K 3/0008 |
| 10,112,269 B2* | 10/2018 | Mantani | B23K 3/08 |
| 2014/0318393 A1* | 10/2014 | Kobayashi | B41F 15/0881 |
| | | | 101/123 |
| 2015/0129641 A1* | 5/2015 | Kuroda | B23K 3/0638 |
| | | | 228/41 |

* cited by examiner

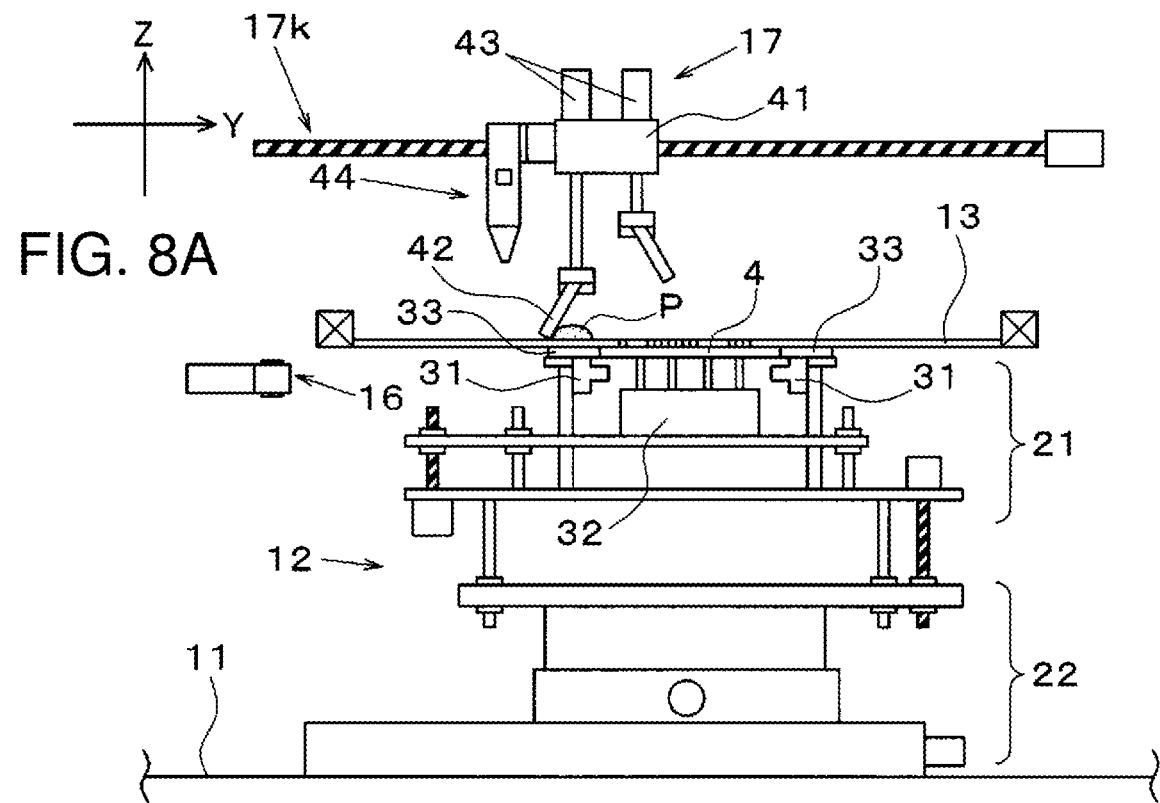
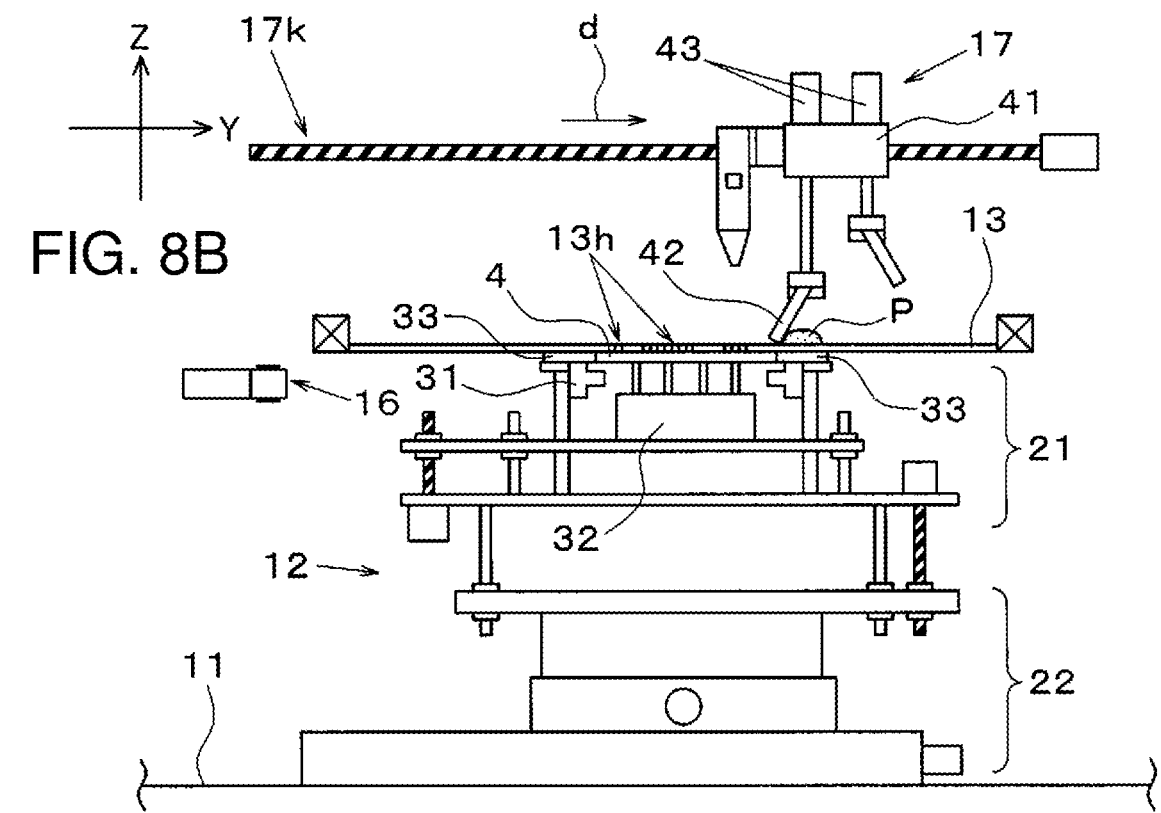

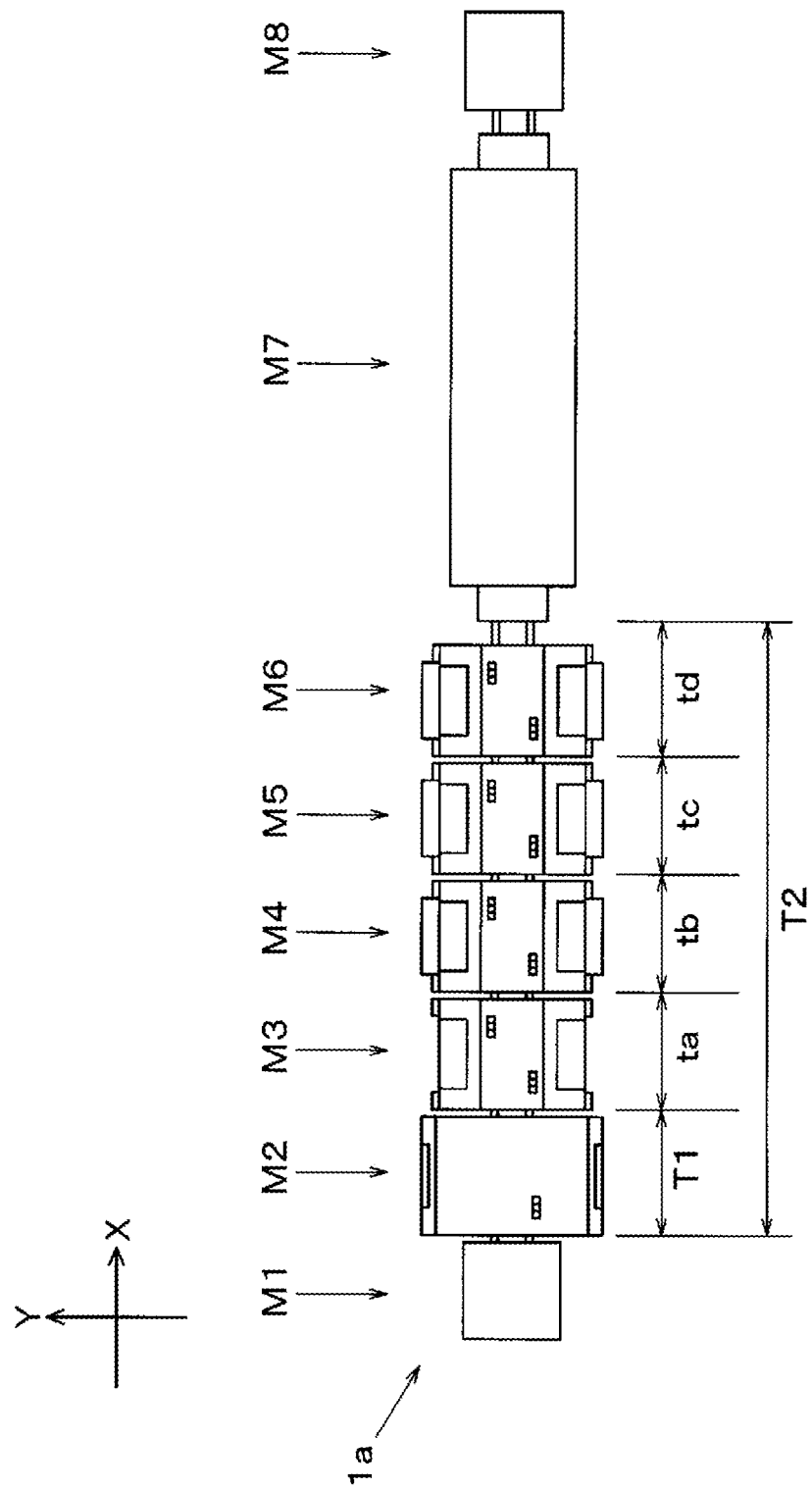

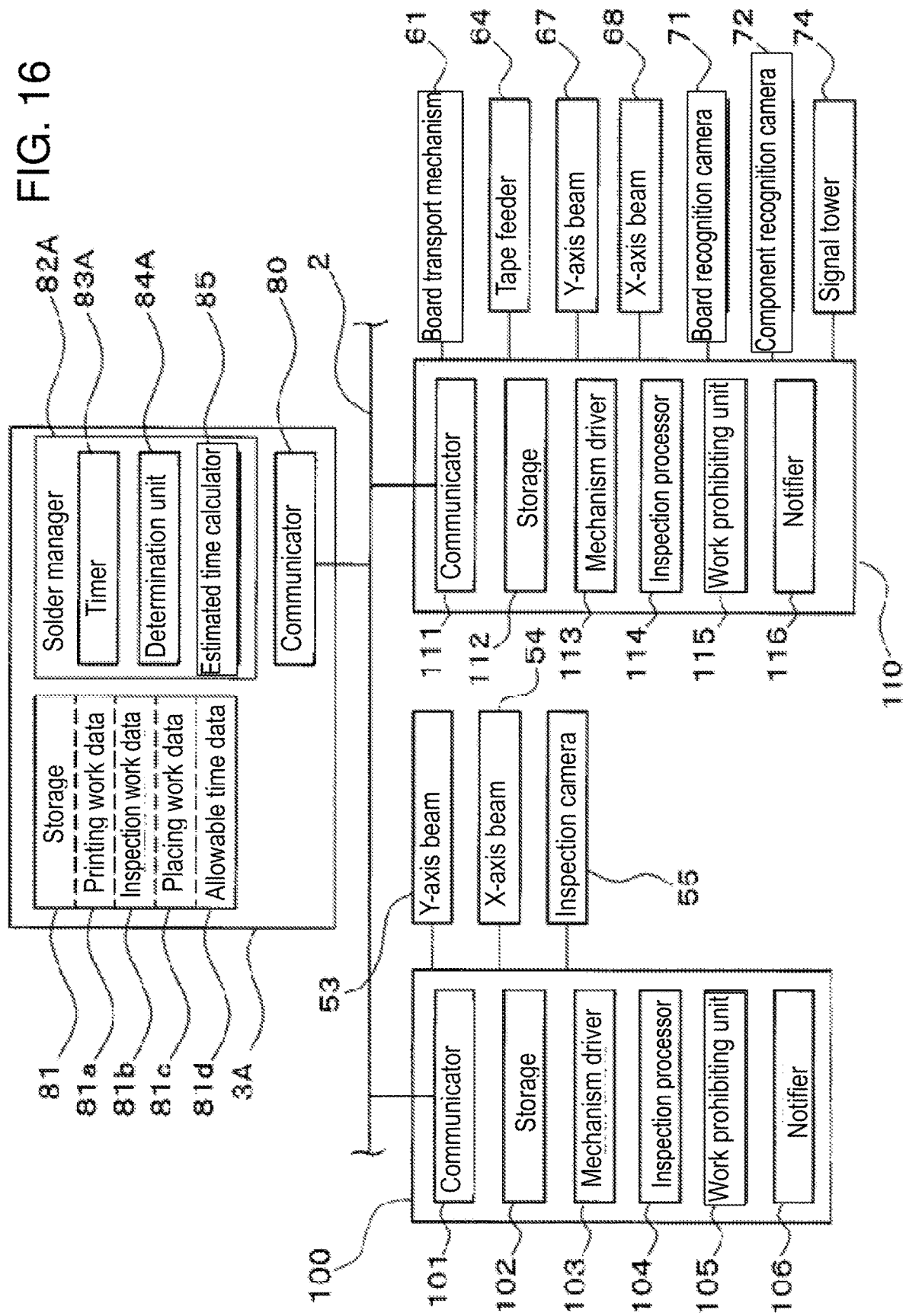

PRINTING DEVICE, SOLDER MANAGEMENT SYSTEM, AND PRINTING MANAGING METHOD

BACKGROUND

1. Technical Field

The present invention relates to a printing device that prints solder onto a board, a solder management system provided with the printing device, and a printing managing method.

2. Description of the Related Art

A configuration, in which a squeezing operation to cause a squeegee to slide on a screen mask is executed in a state where the bottom surface of the screen mask to which paste-like solder is supplied is set on a board, is known as a printing device that prints the solder onto an electrode of the board. An electronic component is mounted onto the board, on which the solder is printed, by an electronic component mounter. The board, on which the electronic component is mounted, is reflowed by a reflow device. Accordingly, the board and the electronic component are bonded together with the solder.

The solder supplied onto the screen mask gradually dries by being exposed to the air. Once the solder that has dried to a certain extent is printed onto the board and the electronic component is mounted onto the board with aid of this solder, the bonding of the electronic component with respect to the board becomes insufficient and thus mounting failure might occur. Meanwhile, in the related art, in a case where time for which the use of the solder is allowed is set and the board after solder printing is determined not to be reflowed by the reflow device within the time, work with respect to the board ceases (refer to PTL 1). In an example described in PTL 1, a sum of elapsed time after the solder is printed onto the board and time estimated to be required for work in a mount device (for example, electronic component mounter) is obtained. In a case where this sum is determined to exceed allowable time, which is time allowed as the elapsed time from printing to melting of the solder, the work respect to the board ceases.

CITATION LIST

Patent Literature

PTL 1: Japanese Patent No. 5292163

SUMMARY

A printing device of the disclosure prints solder of paste onto a board by causing a squeegee to slide with respect to a screen mask to which the solder is supplied. The printing device includes a storage that stores allowable time for which use of the solder supplied to the screen mask can be allowed, a timer that measures time for which the solder is supplied to the screen mask, a determination unit that determines whether or not use of the solder supplied to the screen mask has exceeded the allowable time, based on the time measured by the timer, and a notifier that notifies a worker in a case where the determination unit determines that the use of the solder supplied to the screen mask has exceeded the allowable time, in which the timer measures time by weighting time for which the solder is moved on the screen mask by the squeegee or time for which the solder does not move on the screen mask.

A solder management system of the disclosure has a printing device that prints solder of paste onto a board by causing a squeegee to slide with respect to a screen mask to which the solder is supplied. The solder management system includes a storage that stores allowable time for which use of the solder supplied to the screen mask can be allowed, a timer that measures time for which the solder is supplied to the screen mask, a determination unit that determines whether or not use of the solder supplied to the screen mask has exceeded the allowable time, based on the time measured by the timer, and a notifier that notifies a worker in a case where the determination unit determines that the solder supplied to the screen mask has exceeded the allowable time, in which the timer measures time by weighting time for which the solder is moved on the screen mask by the squeegee or time for which the solder does not move on the screen mask.

A priming managing method of the disclosure used in a printing device that prints solder of paste onto a board by causing a squeegee to slide with respect to a screen mask to which the solder is supplied, and has a storage that stores allowable time for which use of the solder supplied to the screen mask can be allowed. The printing managing method includes measuring time by weighting time for which the solder is moved on the screen mask by the squeegee or time for which the solder does not move on the screen mask; determining whether or not use of the solder supplied to the screen mask has exceeded the allowable time, based on the time measured in the measuring; and notifying a worker in a case where the determination is made that, the use of the solder supplied to the screen mask has exceeded the allowable time in the determining.

According to the disclosure, the solder can be more accurately managed and the generation of the defective board can be prevented.

BRIEF DESCRIPTION OF THE DRAWINGS

FIGS. 8A and 8B are explanatory diagrams of the printing operation performed by the printing device in exemplary embodiments 1 and 2 of the invention;

FIG. 13 is an explanatory diagram of time (allowable time) for which use of solder can be allowed in exemplary embodiment 1 of the invention;

FIG. 16 is a block diagram illustrating a configuration of a part of a control system of the electronic component mounting system in exemplary embodiment 2 of the invention;

DETAILED DESCRIPTION

Before an exemplary embodiment of the disclosure is described, a problem in the related art is briefly described. In the related art, there are the following problems attributable to the measurement of the elapsed time after the solder is printed onto the board. In other words, the solder continues to dry from a time point when the solder is supplied to the screen mask and is exposed to the air. In addition, the progressing degrees of dryness of the solder which is supplied to the screen mask are different between a state of moving on the screen mask in response to the effect of the squeegee and a state of standing still on the screen mask. However, in the related art, a point that the progressing degree of dryness varies depending on the state of the solder on the screen mask is not considered. Therefore, a situation, in which the board is sent to the subsequent step that involves the reflow device regardless of the fact that the solder on the board has dried to a state where the solder cannot be actually used and thus a defective board is manufactured eventually, occurs. As in the above description, in the related art, there is room for improvement in terms of the management of the solder.

An object of the invention is to provide a printing device, a solder management system, and a printing managing method that can manage the solder more accurately and can prevent the generation of the defective board.

(Exemplary Embodiment 1)

Figure 1:
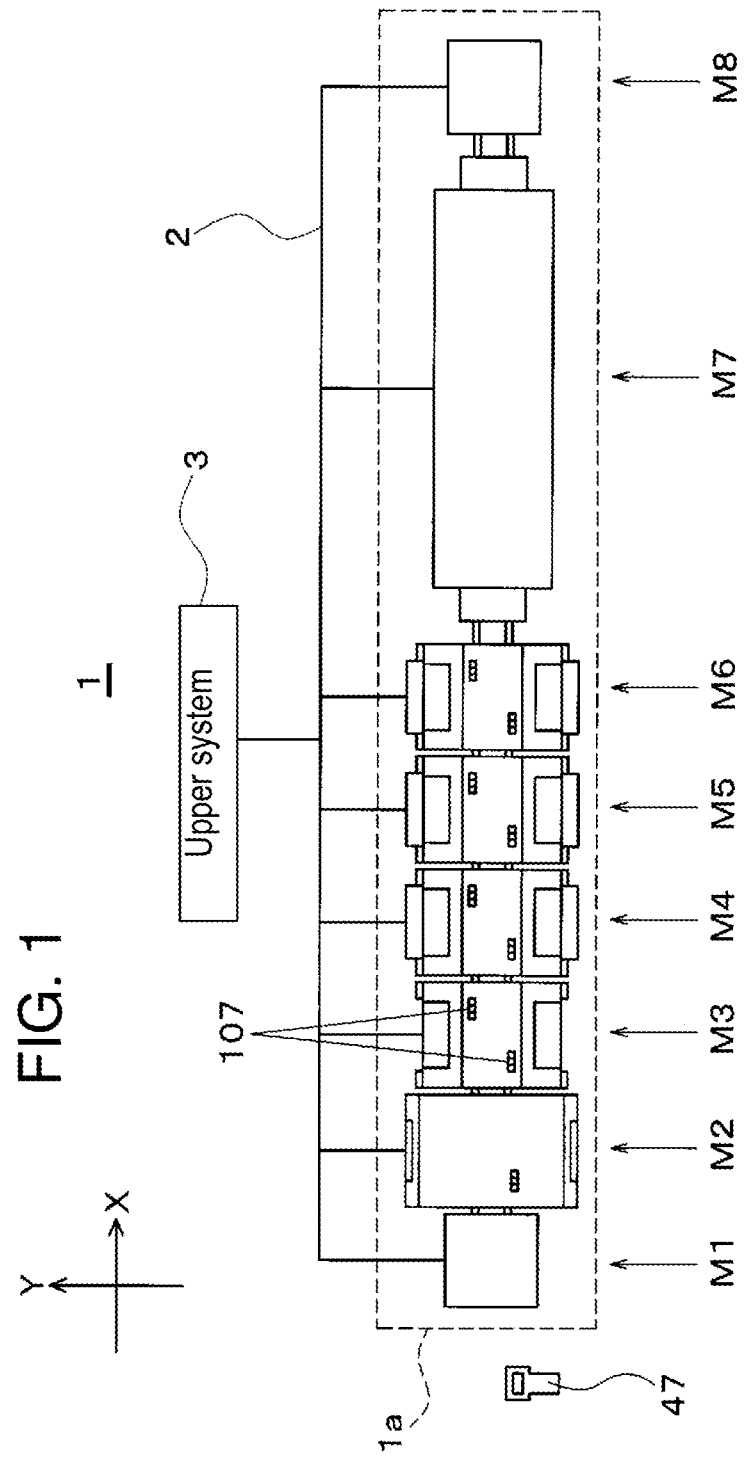
FIG. 1 is a view schematically illustrating an overall configuration of an electronic component mounting system in exemplary embodiments 1 and 2 of the invention.

First, description will be given of an overall configuration of an electronic component mounting system in exemplary embodiment 1 of the invention with reference to FIG. 1. Electronic component mounting system 1 has a function of manufacturing a mounting board, which is a board on which an electronic component is mounted, and is configured to include mounting line 1a in which board supplier M1, printing device M2, printing inspection device M3, a plurality of electronic component placing devices M4, M5, and M6, reflow device M7, and board collector M8 are sequentially disposed from an upstream side. These devices are connected to upper system 3 via communication network 2 such as a LAN. Hereinafter, a board transport direction will be defined as an X-axis direction, a direction perpendicular to the X-axis direction in a horizontal plane will be defined as a Y-axis direction, and a direction perpendicular to an XY plane will be defined as a Z-axis direction.

Board supplier M1 supplies a board, which is a work target, to printing device M2. Printing device M2 prints cream-like solder paste (hereinafter, simply referred to as "solder") onto an electrode formed on the board. Printing inspection device M3 inspects the state of the solder printed on the board. Electronic component placing devices M4, M5, and M6 place the electronic component onto the board on which the solder is printed. Reflow device M7 has a melting zone for melting the solder, melts the solder by reflowing the board, on which the electronic component is placed, in accordance with a predetermined heating profile, and bonds the board and the electronic component together with the solder. Accordingly, the mounting board is manufactured. Board collector M8 collects the board after reflow. Printing inspection device M3 and electronic component placing devices M4 to M6 are examples of a mount device that performs work for mounting the electronic component onto the board on which the solder is printed by printing device M2.

Figure 2:
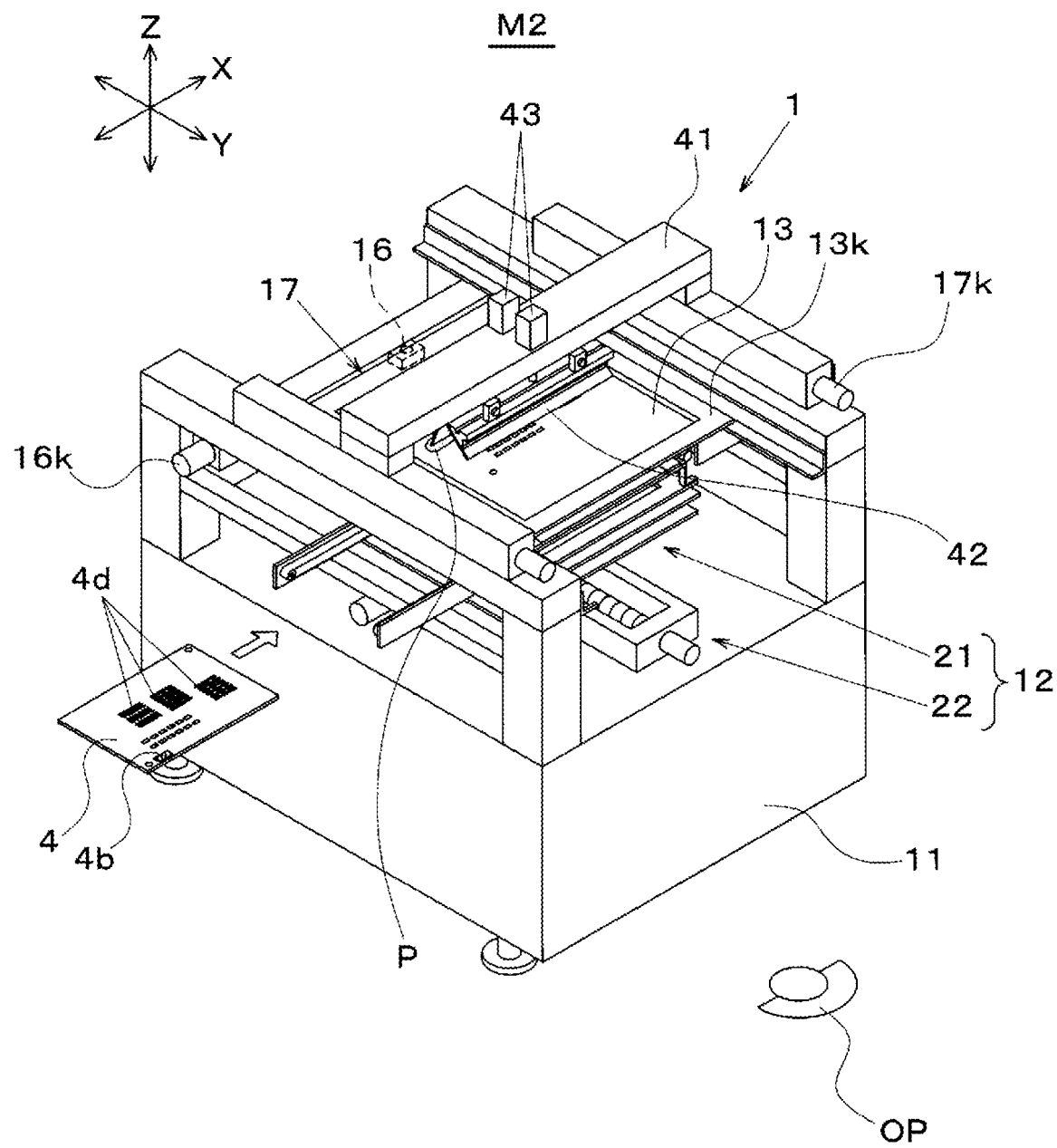
FIG. 2 is a perspective view of a printing device in exemplary embodiments 1 and 2 of the invention.
Figure 3:
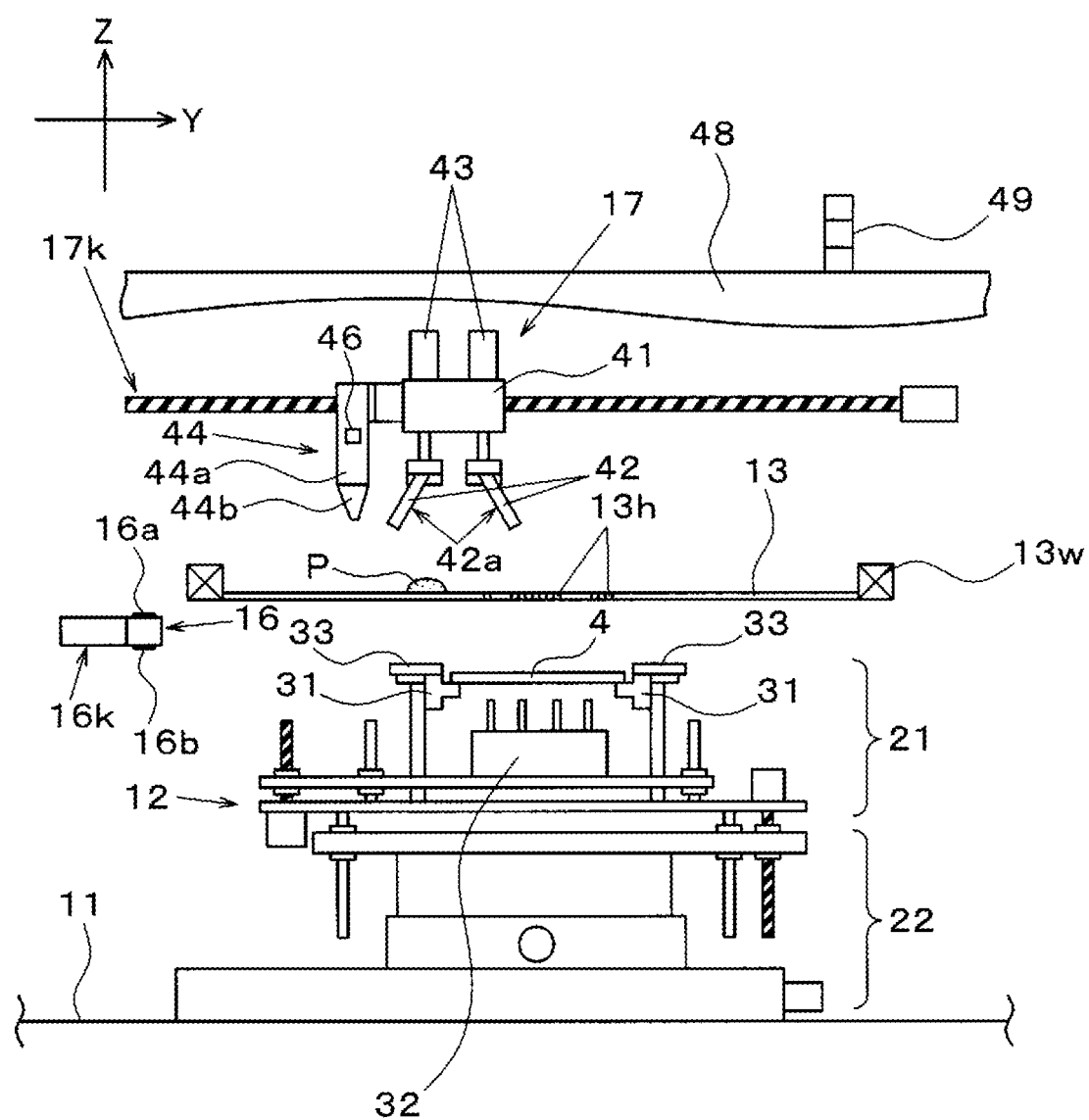
FIG. 3 is a side view of the printing device in exemplary embodiments 1 and 2 of the invention.
Figure 4:
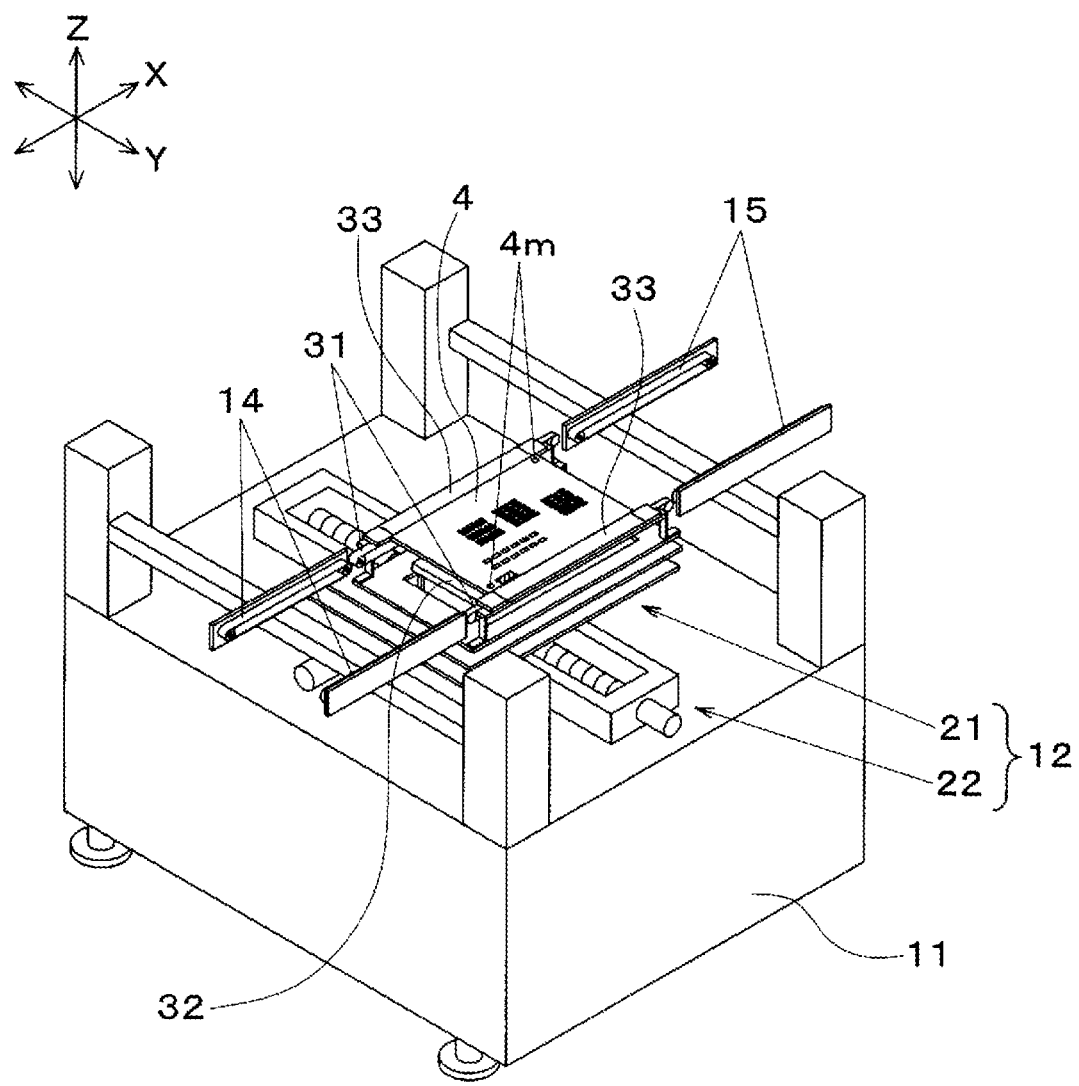
FIG. 4 is a partial perspective view of the printing device in exemplary embodiments 1 and 2 of the invention.
Figure 5:
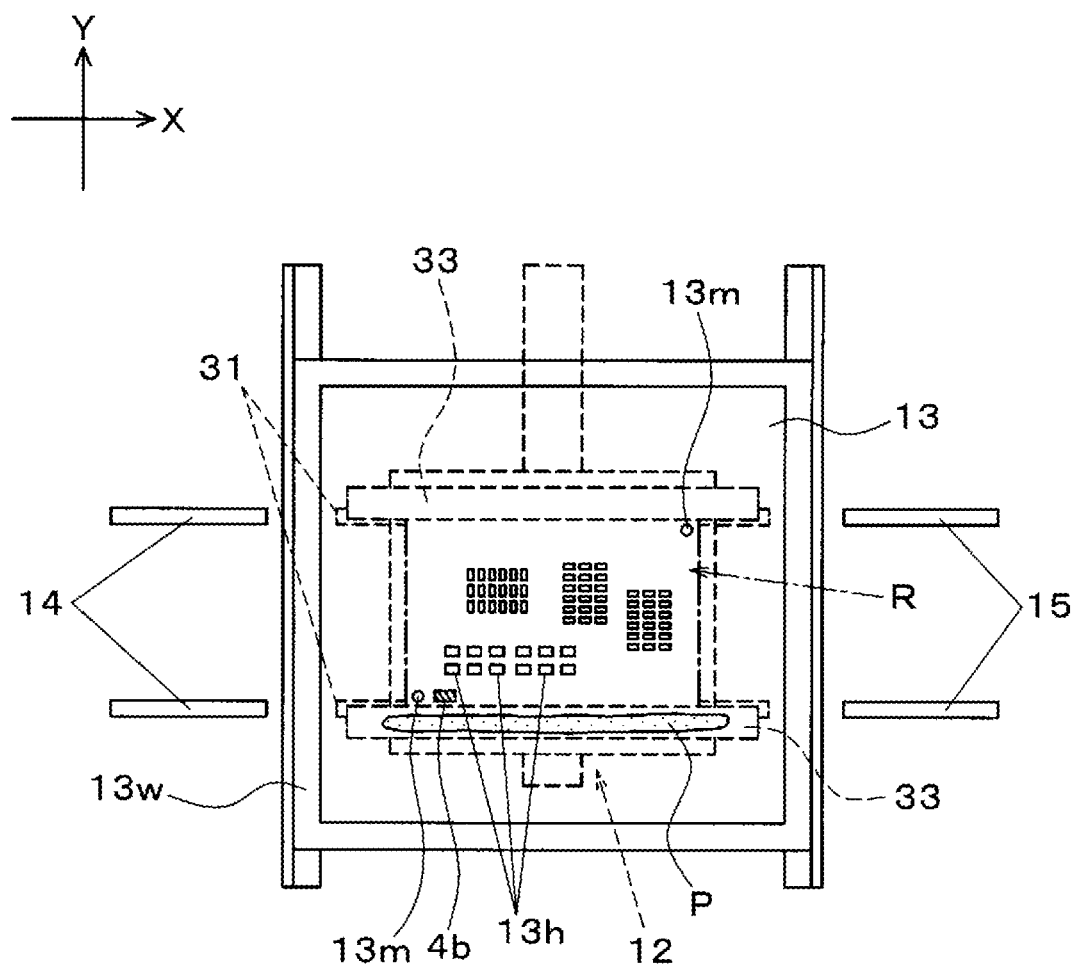
FIG. 5 is a partial plan view of the printing device in exemplary embodiments 1 and 2 of the invention.

Description will be given of printing device M2 with reference to FIG. 2 to FIGS. 8A and 8B. In FIG. 2 and FIG. 3, printing device M2 is provided with board holding movement mechanism 12 on table 11 and screen mask 13 is provided above board holding movement mechanism 12. In FIG. 4 and FIG. 5, bring-in conveyor 14 that receives board 4 supplied from board supplier M1 and transports board 4 to board holding movement mechanism 12 is provided on the upstream side of board holding movement mechanism 12 in the X-axis direction. Bring-out conveyor 15 that receives board 4, on which solder P is printed, from board holding movement mechanism 12 and brings out board 4 to printing inspection device M3 is provided on the downstream side of board holding movement mechanism 12 in the X-axis direction.

in FIG. 3 and FIG. 4, board holding movement mechanism 12 is configured to include board holder 21 and moving table 22. Board holder 21 is provided with positioning conveyor 31, lower receiving unit 32, and a pair of clampers 33. Positioning conveyor 31 positions board 4 received from bring-in conveyor 14 at a predetermined clamp position. Lower receiving unit 32 supports board 4 positioned at the clamp position from below. The pair of clampers 33 clamps and supports both sides of board 4.

Moving table 22 includes XYθ table mechanism 22a (FIG. 12), in which is a plurality of table mechanisms are stacked in multiple stages, and moves board holder 21 in the X-axis direction, the Y-axis direction, and the Z-axis direction. Accordingly, board 4 comes into contact with the bottom surface of screen mask 13 and is positioned at a printing work position.

In FIG. 2 and FIG. 5, screen mask 13 is configured of a metal member in a rectangular flat-plate shape that spreads in the XY plane and the outer periphery thereof is supported by frame member 13W. A rectangular area in the middle of screen mask 13 is board contact area R in which the bottom surface thereof comes into contact with board 4 and a plurality of openings 13h corresponding to the dispositions of electrodes 4d (FIG. 2) formed on board 4 are provided in board contact area R.

In FIG. 3, camera 16 is provided in a region below screen mask 13 so as to move freely in the X-axis direction and the Y-axis direction. Camera 16 is provided with upper capture 16a of which an imaging visual field faces upward and lower capture 16b of which an imaging visual field faces downward. Camera 16 moves in the XY plane by being driven by camera moving mechanism 16K of which an actuator is a ball screw mechanism. Upper capture 16a images a pair of mask-side marks 13m (FIG. 5) provided on screen mask 13. Lower capture 16b images a pair of board-side marks 4m (FIG. 4) provided on board 4 and images barcode label 4b (FIG. 5) provided on one corner of board. 4.

In FIG. 2 and FIG. 3, printing head 17 is provided in a region above screen mask 13 so as to move freely in the Y-axis direction. Printing head 17 is configured to include moving base 41, two squeegees 42, and two squeegee lifting and lowering cylinders 43. Moving base 41 is a member extending in the X-axis direction and moves in the Y-axis direction by being driven by printing bead moving mechanism 17k of which an actuator is a ball screw mechanism. Each of squeegees 42 is arranged in the Y-axis direction with respect to moving base 41 so as to oppose each other and integrally moves in the Y-axis direction in response to the movement of moving base 41 in the Y-axis direction. Each of two squeegees 42 is a member in a "spatula" shape, which extends in the X-axis direction, and extends obliquely downward in an orientation of spreading downward together. The surfaces of squeegees 42, which oppose each other, are scraping surfaces 42a for solder P.

Squeegee lifting and lowering cylinders 43 corresponding to each of squeegees 42 are provided so as to be arranged in the Y-axis direction with respect to moving base 41. Two squeegee lifting and lowering cylinders 43 operate separately and lift and lower squeegees 42 independently of moving base 41. Each of squeegee lifting and lowering cylinders 43 lifts and lowers corresponding squeegee 42 between a stand-by height position (FIG. 3) at which the bottom, ends of corresponding squeegees 42 are spaced away from the top surface of screen mask 13 at a predetermined distance and an abutting height position (FIG. 8A) at which the bottom end thereof abuts against screen mask 13.

In FIG. 3, syringe 44 that moves freely along the X-axis direction, which is a longitudinal direction of squeegee 42, is provided on moving base 41. Syringe 44 is provided with container 44a which contains solder P in a vacuum state and discharger 44b with a discharge opening thereof, from which solder P is discharged, facing screen mask 13. By being driven by syringe driving mechanism 45 (FIG. 12), syringe 44 supplies solder P stored in container 44a to screen mask 13 via discharger 44b. Syringe 44 is a solder supplier that supplies solder P to screen mask 13. In addition, container 44a is a solder storage unit that stores solder P before solder P is supplied to screen mask 13. The solder supplier is not limited to syringe 44 and any forms may be adopted.

Barcode label 46 is attached to container 44a. Identification information for identifying container 44a is recorded in barcode label 46. Barcode label 46 is read by barcode reader 47 (FIG. 1) connected to printing device M2 and upper system 3 so as to be capable of communicating with each other. Barcode reader 47 is provided with a communicator and transmits read barcode label 46 to printing device M2.

In FIG. 3, signal tower 49 is provided so as to rotate freely on the top surface of housing 48 of printing device M2 such that signal tower 49 assumes a fallen posture or a standing posture with respect to housing 48. Signal tower 49 flashes in a case where an abnormality occurs in printing device M2 or the like to notify worker OP (FIG. 2).

Figure 6A:
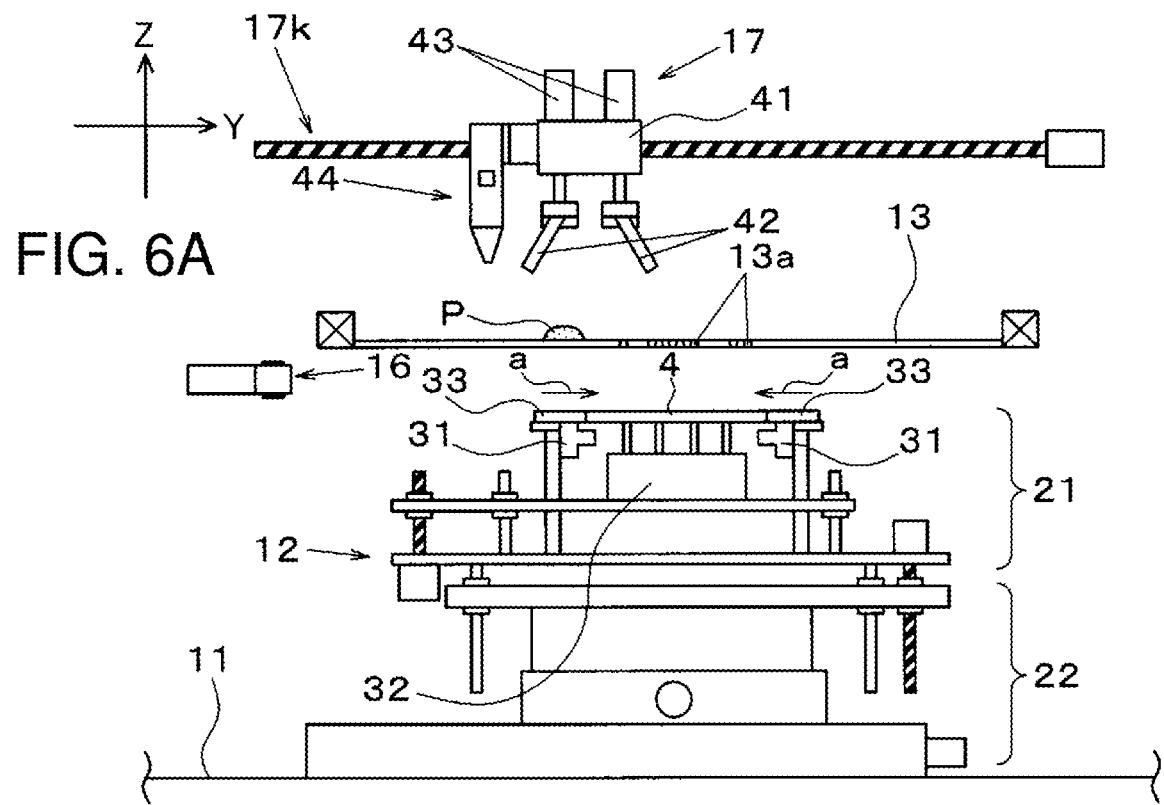
FIGS. 6A and 6B are explanatory diagrams of a printing operation performed by the printing device in exemplary embodiments 1 and 2 of the invention.
Figure 6B:
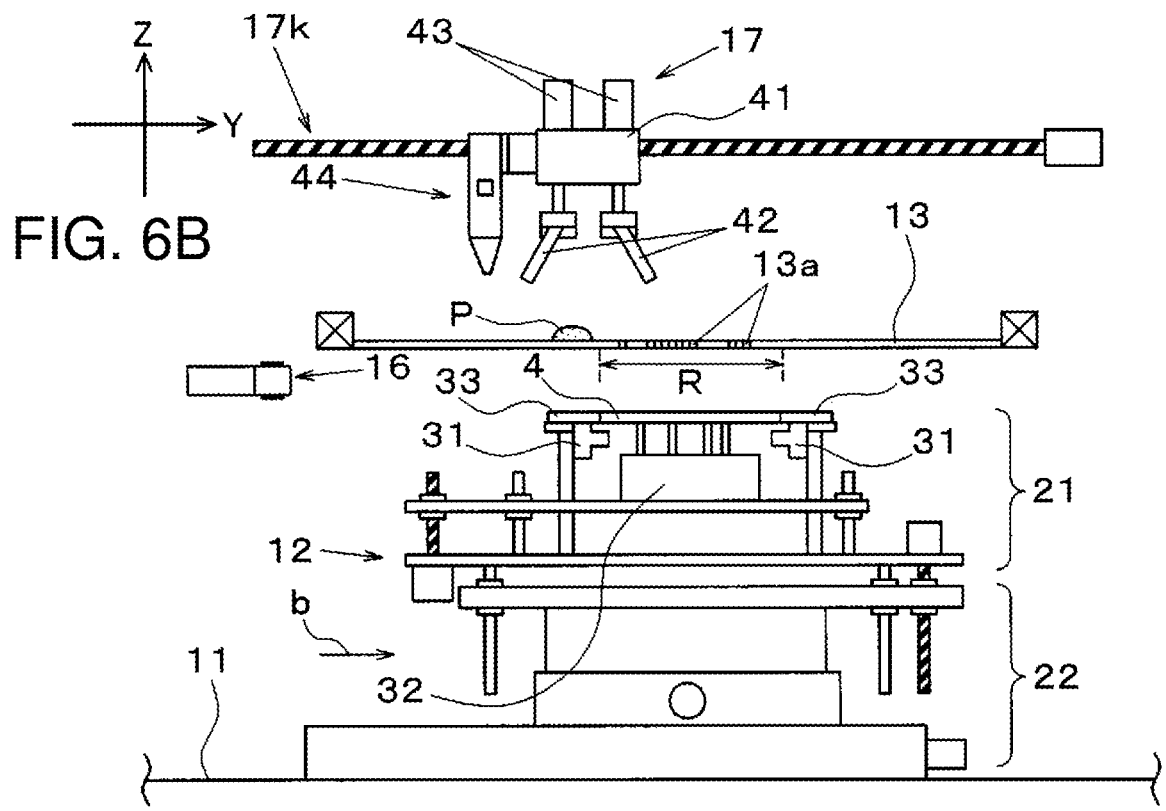

Next, description will be given of an operation of printing device M2. The following operation is performed by controller 90 (FIG. 12), which is provided in printing device M2, controlling various types of mechanisms. First, as illustrated in FIG. 6A, board holder 21 positions board 4, which is received from bring-in conveyor 14, at the predetermined clamp position by means of positioning conveyor 31 and clamps (arrow a) board 4 by means of clampers 33 after board 4 is supported by lower receiving unit 32 from below. Next, as illustrated in FIG. 6B moving table 22 moves board holder 21 and positions (arrow b) board 4 below board contact area E of screen mask 13.

Figure 7A:
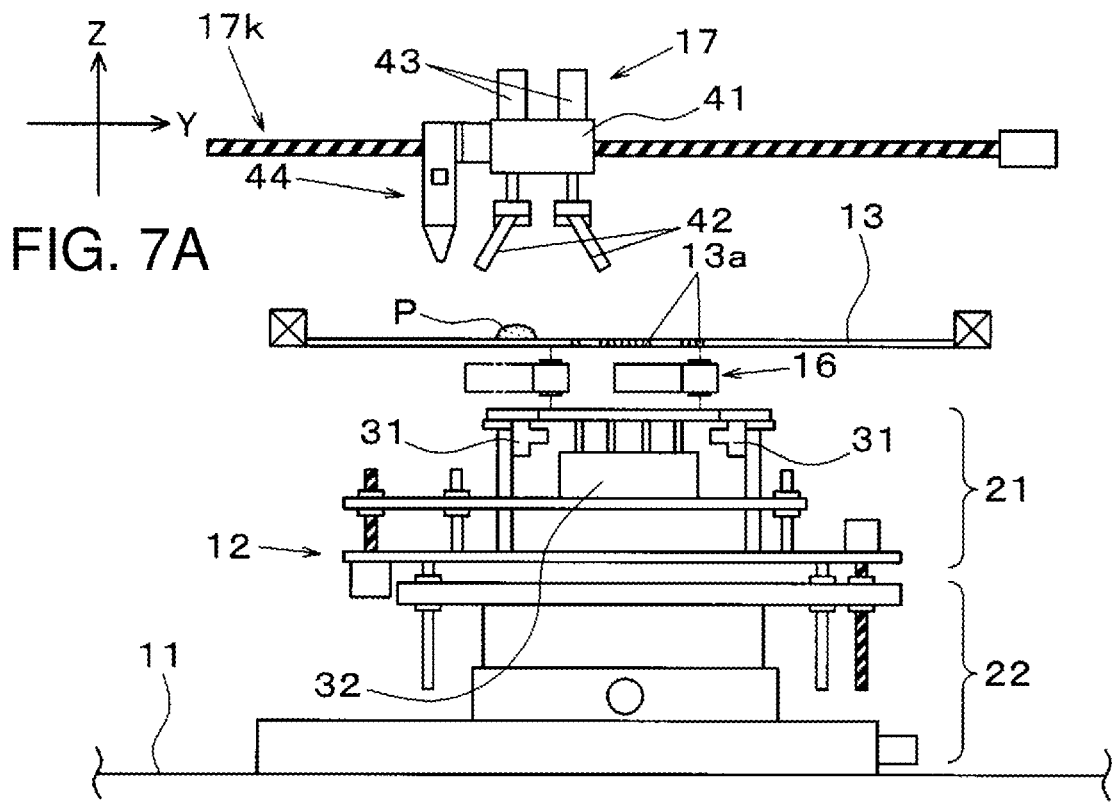
FIGS. 7A and 7B are explanatory diagrams of the printing operation performed by the printing device in exemplary embodiments 1 and 2 of the invention.
Figure 7B:
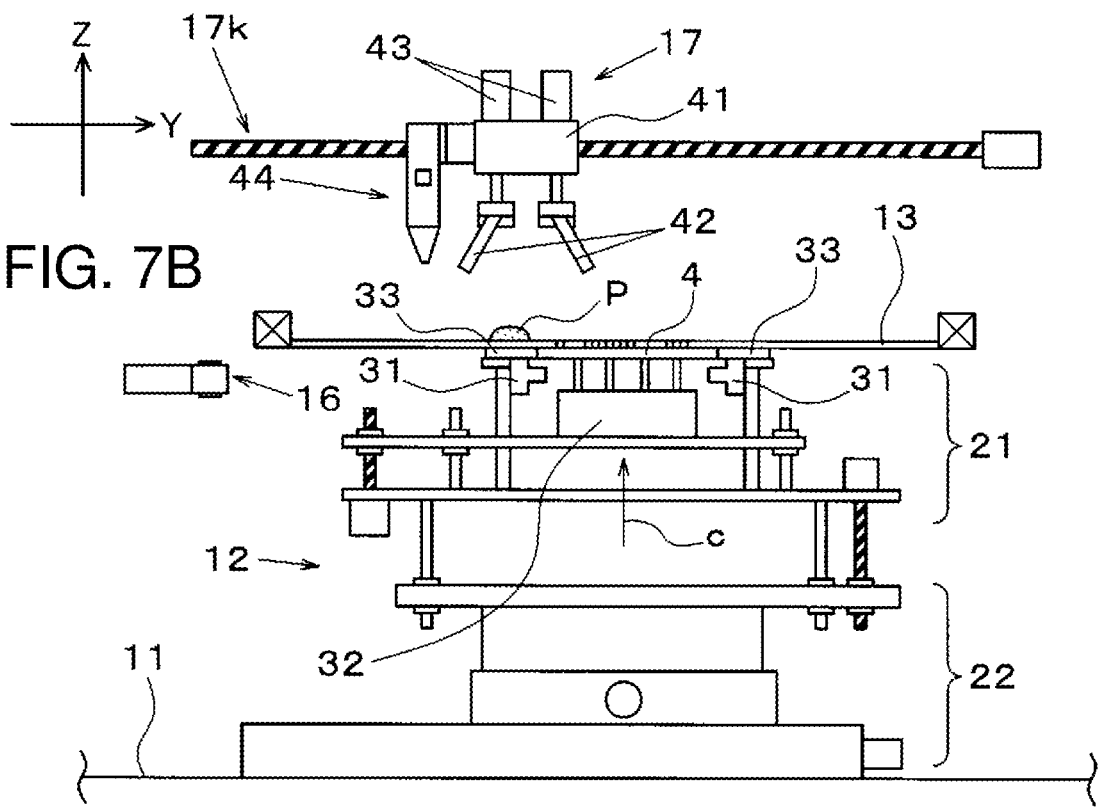

Next, as illustrated in FIG. 7A, upper capture 16a images the pair of mask-side marks 13m (FIG. 5) provided within board contact area R from below. In addition, lower capture 16b images the pair of board-side marks 4m (FIG. 4) of board 4 held by board holder 21. Next, as illustrated in FIG. 7B, board holding movement mechanism 12 moves board 4 such that mask-side marks 13m match board-side marks 4m in plan view and then lifts board 4, bringing board 4 into contact with (arrow c) hoard contact area R. Accordingly, each electrode 4d agrees with corresponding opening 33h and is exposed on a top surface side of screen mask 13.

In a state where board 4 is in contact with board contact area R, each clamper 33 conies into contact with the bottom surface of screen mask 13 in an area outside board contact area R. As illustrated in FIG. 5, solder P is supplied to an area on screen mask 13, which corresponds to the upper side of one clamper 33, outside board contact area R (FIG. 5).

Next, squeegees 42 execute a squeezing operation. In other words, as illustrated in FIG. 8A, the bottom end of one squeegee 42 abuts against screen mask 13 by being lowered to the abutting height position above clamper 33. Next, as illustrated in FIG. 8B, moving base 41 causes one squeegee 42 to slide (arrow d) on screen mask 13 by moving in the Y-axis direction. Solder P scraped by squeegee 42 is rolled on screen mask 13 and fills the opening 13h when passing through opening 13h. While squeegee 42 slides, stress is applied to solder P and solder P comes into a state where the viscosity thereof has declined. Squeegee 42 moved from one clamper 33 to the upper side of other clamper 33 is lifted to the stand-by height position.

Alter solder P fills the opening, board holding movement mechanism 12 lowers board holder 21 to perform plate releasing. Accordingly, solder portions Pa (FIG. 9), which are layers of solder P corresponding to the thickness of screen mask 13, are formed on electrodes 4d of board 4. Next, board holding movement mechanism 12 opens clampers 33 to release the holding of board 4 and operates positioning conveyor 31 to deliver board 4 to bring-out conveyor 15. Bring-out conveyor 15 brings out received board 4 to downstream printing inspection device M3. Accordingly, work performed by printing device M2 is terminated. After then, new board 4 is brought into printing device M2 and other squeegee 42 slides to print solder P onto this board 4. As in the above description, printing device M2 in exemplary embodiment 1 prints solder P onto board 4 by causing squeegees 42 to slide with respect to screen mask 13 to which paste-like solder P is supplied.

Figure 9:
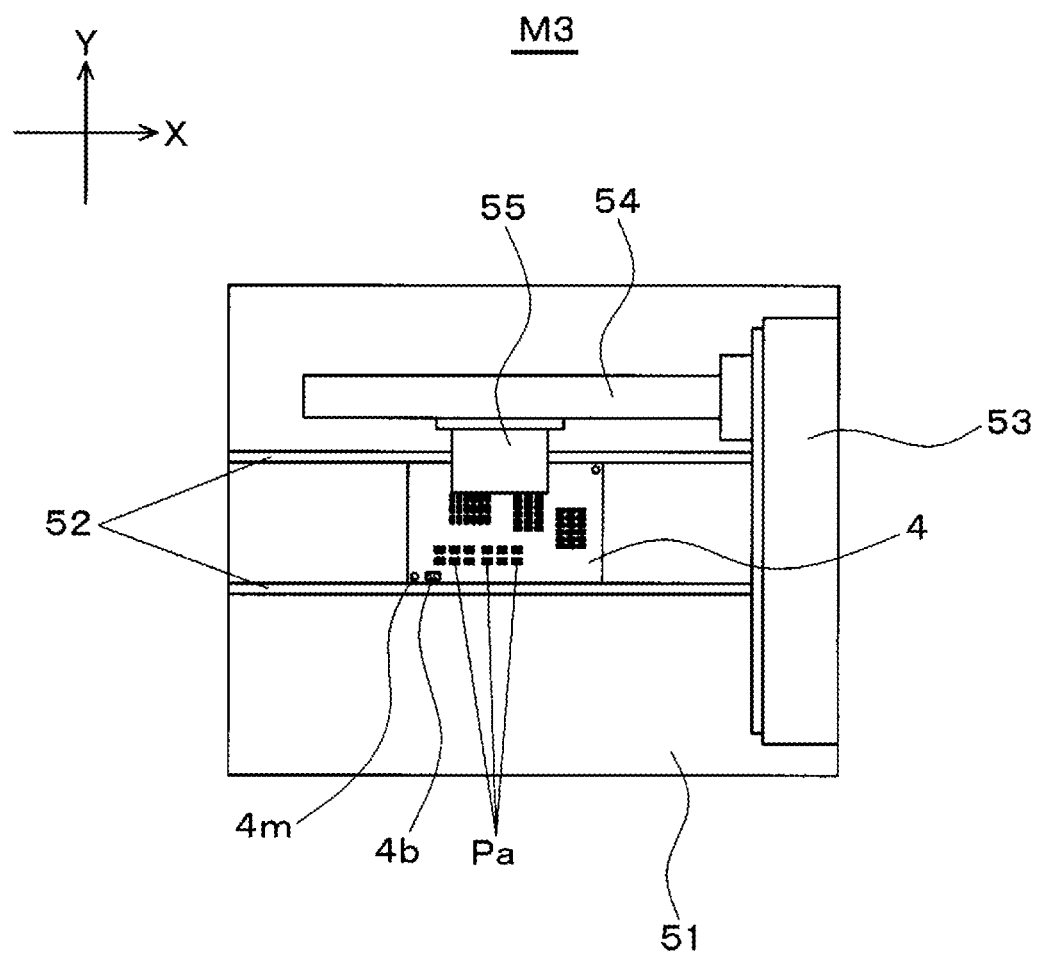
FIG. 9 is a plan view of a printing inspection device in exemplary embodiments 1 and 2 of the invention.

Next, with reference to FIG. 9, description will be given of a configuration of printing inspection device M3. Board transport mechanism 52 connected to printing device M2 and electronic component placing device M4 is provided on the top surface of table 51. Board transport mechanism 52 transports board 4 after solder printing, which is brought out from printing device M2, and positions board 4 at a predetermined inspection position. Inspection camera 55 that is moved horizontally by a camera moving mechanism, which consists of Y-axis beam 53 extending in the Y-axis direction and X-axis beam 54 extending in the X-axis direction, is provided above board transport mechanism 52. By operating the camera moving mechanism, inspection camera 55 moves above board 4 positioned at the inspection position and images solder portion Pa.

By recognition processing being performed on imaging data of solder portion Pa by inspection processor 104 (FIG. 16) provided in printing inspection device M3, various types of inspections are executed on the print state of solder P printed on board 4. For example, an inspection as to whether or not a printed amount of solder portion Pa is sufficient is an example of an item of inspection executed by inspection processor 104. A function of printing inspection device M3 may be incorporated into printing device M2 and printing device M2 may perform the inspection.

Next, description will be given of electronic component placing devices M4 to M6 with reference to FIG. 10 and FIG. 11. Board transport mechanism 61 provided with a pair of transport conveyors extending in the X-axis direction is provided in the middle portion of table 60. Board transport mechanism 61 transports board 4 to position board 4 at a predetermined mounting work position. Each of component suppliers 62 is disposed on both sides of board transport mechanism 61. A plurality of tape feeders 64 installed on carriages 63 are disposed in component supplier 62. Tape feeders 64 supply electronic component 5 to a component picking-up position, at which placing head 69 that will be described later picks up components, by pitch feeding carrier tape 65 holding electronic component 5. Carrier tape 65 is wound around and stored in supply reel 66 held by carriage 63 so as to rotate freely.

Y-axis beam 67 is provided at one end portion of table 60 in the X-axis direction and X-axis beam 68 is laid across Y-axis beam 67 so as to move freely in the Y-axis direction. Placing head 69 is installed on X-axis beam 68 so as to move freely in the X-axis direction. Placing head 69 moves in the XY plane by the driving of Y-axis beam 67 and X-axis beam 68.

A plurality of suction nozzles 70, which are capable of sucking and holding electronic component 5, are installed in placing head 69. Suction nozzle 70 picks up electronic component 5 supplied to the component picking-up position and places electronic component 5 onto board 4.

Figure 10:
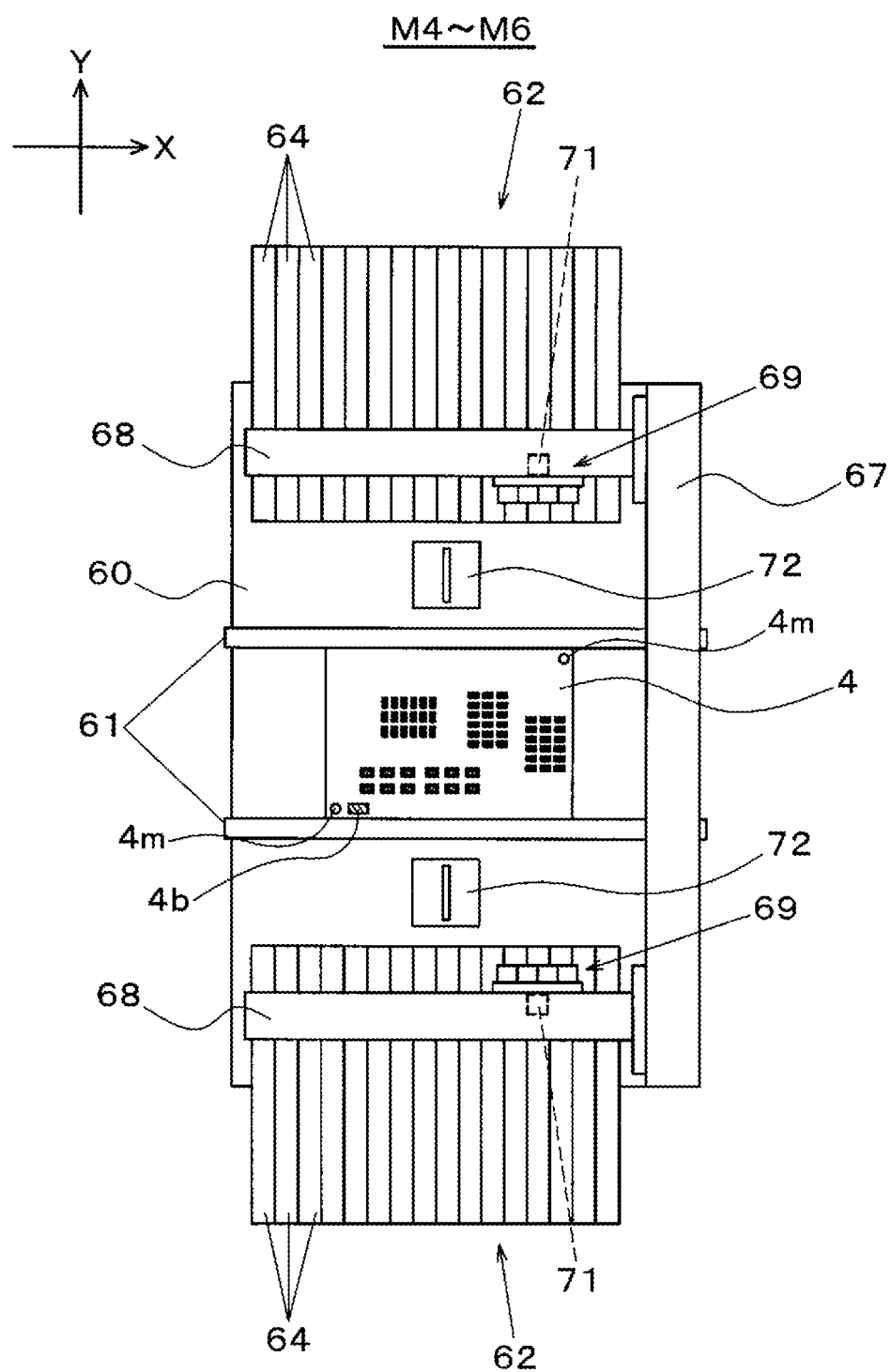
FIG. 10 is a plan view of an electronic component placing device in exemplary embodiments 1 and 2 of the invention.

In FIG. 10, placing head 69 is provided with board recognition camera 71 of which an imaging visual field faces downward. Board recognition camera 71 images board-side marks 4$m$ or barcode label 4$b$ of board 4 positioned at the mounting work position. Component recognition camera 72 of which an imaging visual field faces upward is provided between board transport mechanism 61 and tape feeder 64. Component recognition camera 72 images, from below, electronic component 5 held by placing head 69 that moves above component recognition camera 72. In FIG. 11, Y-axis beam 67, X-axis beam 68, board recognition camera 71, and the like are not illustrated.

Figure 11:
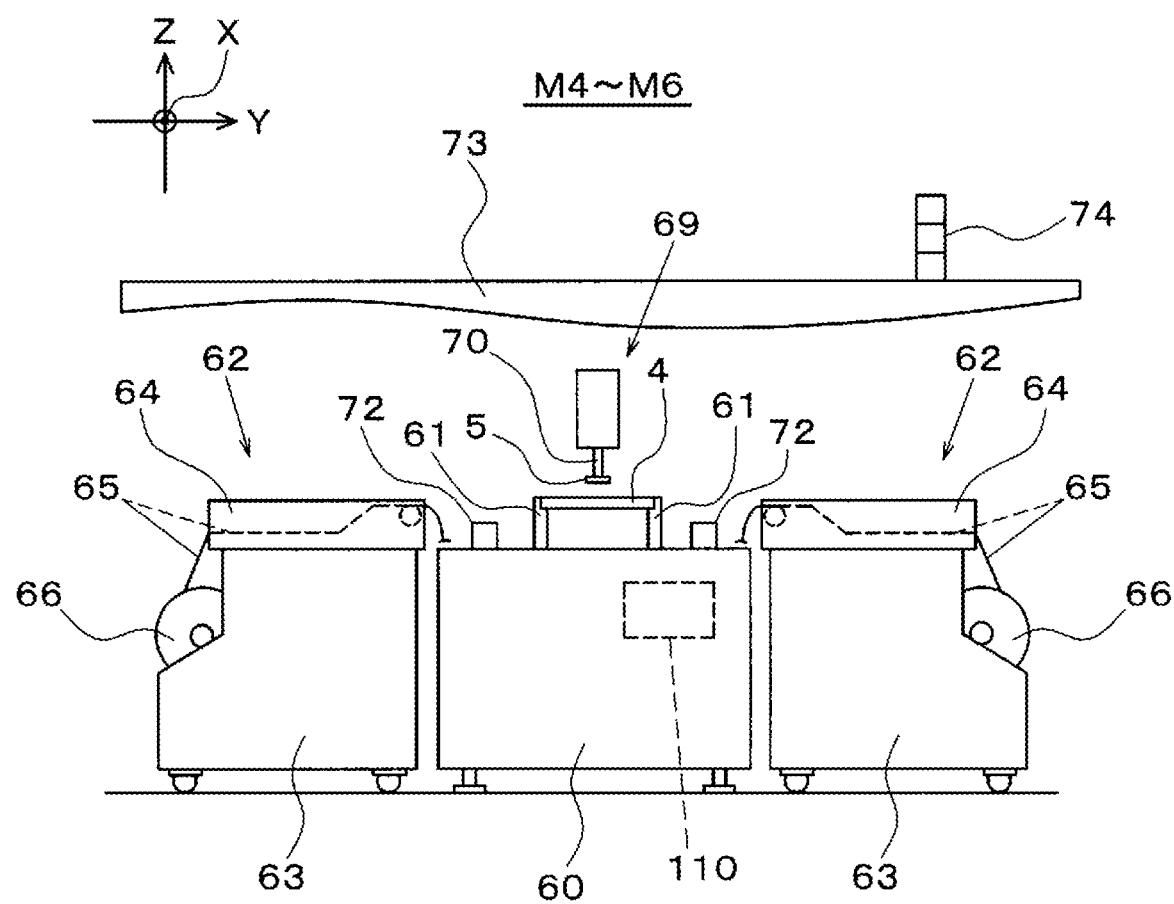
FIG. 11 is a side view of the electronic component placing device in exemplary embodiments 1 and 2 of the invention.

In FIG. 11, signal tower 74 is provided so as to rotate freely on the top surface of housing 73 of electronic component placing devices M4 to M6 such that signal tower 74 assumes a fallen posture or a standing posture with respect to housing 73. Signal tower 74 flashes in a case where an abnormality occurs in electronic component placing devices M4 to M6 to notify worker OP.

Next, description will be given of an operation of electronic component placing devices M4 to M6. The operation that will be described below is performed by controller 110 (FIG. 16), which is provided in electronic component placing devices M4 to M6, controlling various types of mechanisms. First, board transport mechanism 61 transports board 4 received from the device on the upstream side and positions board 4 at the mounting work position. Next, board recognition camera 71 images board-side marks 4$m$ of board 4. Next, placing head 69 picks up electronic component 5 supplied by tape feeders 64 and moves to the upper side of a desirable mounting point of board 4 by passing through the upper side of component recognition camera 72. At this time, component recognition camera 72 images electronic component 5 held by suction nozzle 70. Next, after a position in the XY plane and θ direction are corrected, placing head 69 places electronic component 5 onto board 4 based on imaging data acquired by imaging performed by board recognition camera 71 of board 4 and component recognition camera 72.

Figure 12:
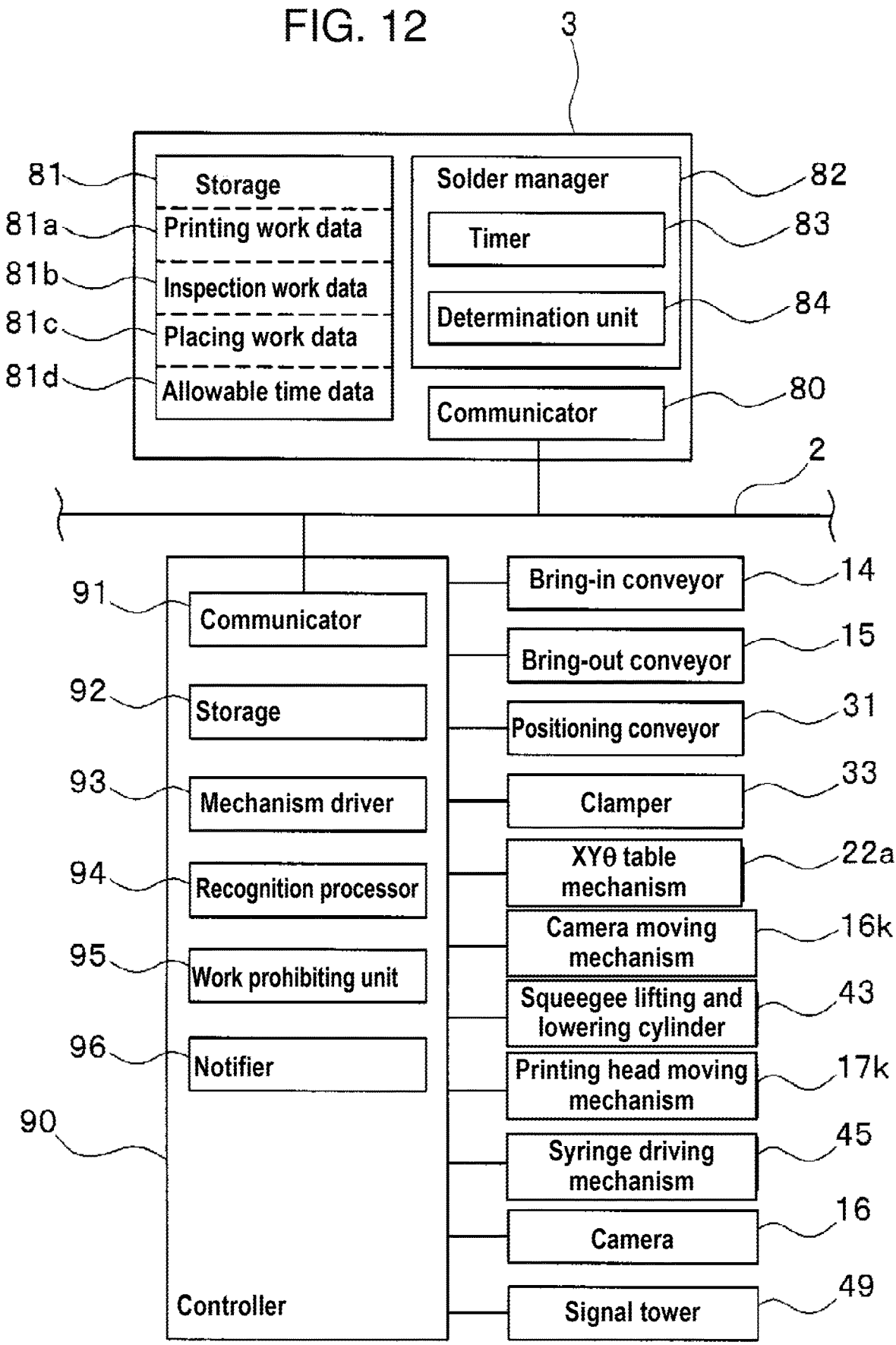
FIG. 12 is a block diagram illustrating a configuration of a part of a control system of the electronic component mounting system in exemplar embodiment 1 of the invention.

Next, description will be given of a configuration of a control system with reference to FIG. 12. In exemplary embodiment 1, description will be limited to upper system 3 and printing device M2. Upper system 3 is configured to include communicator 80, storage 81, and solder manager 82. Communicator 80 receives and transmits a signal from and to communicator 91 of printing device M2.

Storage 81 stores allowable time data 81$d$ in addition to printing work data 81$a$ necessary for printing solder P onto board 4, inspection work data 81$b$ necessary for inspecting the state of solder P (solder portion Pa formed on electrode 4$d$) printed on board 4, and placing work data 81$c$ necessary for placing electronic component 5 onto board 4.

Allowable time data 81$d$ is data in which time (hereinafter, referred to as "allowable time T1") allowed for printing device M2 to use solder P supplied to screen mask 13 is specified. In other words, solder P has thixotropy and gradually dries by being exposed to the air. "Dries" means that the hardness of solder P increases. Once solder P on screen mask 13 has dried to a certain degree or higher, solder P is less likely to fill opening 13$h$, becoming a cause of printing failure. In addition, board 4, on which solder P is printed, receives predetermined work performed by a plurality of mount devices after being brought out from printing device M2. In the meantime, solder P (solder portion Pa) on board 4 keeps drying since solder P is continued to be exposed to the air. Once solder P printed on board 4 has dried to a certain degree or higher, the electrode of electronic component 5 does not integrate with solder P and thus the bonding strength between board 4 and electronic component 5 becomes insufficient, generating a defective board. After being supplied to screen mask 13, solder P keeps drying until solder P melts in reflow device M7 in a state of being printed on board 4. In addition, having solder P supplied onto screen mask 13 as a target, the time that can be allowed for solder P to be exposed to the air until solder P is printed onto board 4 is set as allowable time T1 and solder P is not printed onto board 4 in a case where allowable time T1 is exceeded.

Description will be given of an example of determining allowable time T1 with reference to FIG. 13. Allowable time data 81$d$ includes allowable time T2, which is time that can be allowed for solder P to be exposed to the air after solder P is supplied to screen mask 13, with an aim of manufacturing a mounting board, until solder P melts in reflow device M7 in a state of being printed on board 4. Allowable time T2 may be separately stored in storage 81. In addition, storage 81 stores estimated time ta, which is time estimated to be required for board 4 to receive predetermined work in printing inspection device M3 and be transported to an adjacent downstream side device, and pieces of estimated time tb, tc, and td, which are the pieces of time estimated to be required for board 4 to receive predetermined work in each of electronic component placing devices M4 to M6 and be transported to an adjacent downstream side device.

Therefore, a maximum value of allowable time T1, which can be set in printing device M2, is obtained by subtracting the pieces of estimated time ta, tb, tc, and td from allowable time T2 (maximum value of allowable time T1=T2−(ta+tb+te+td)). Allowable time T1 is determined within a range of the maximum value. The calculation of allowable time T1 is not limited to the above and may be performed based on a variety of ideas. As in the above description, storage 81 stores allowable time T1 of solder P supplied to screen mask 13.

Figure 14A:
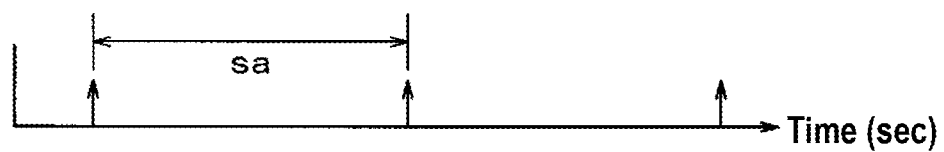
FIGS. 14A and 14B are explanatory diagrams of a measurement interval of time measured by a timer in exemplary embodiments 1 and 2 of the invention.
Figure 14B:
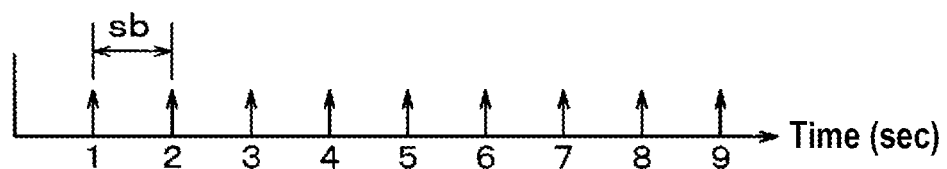

Solder manager 82 manages solder P supplied onto screen mask 13 and has timer 83 and determination unit 84 for serving an internal processing function. Timer 83 measures time for which solder P is supplied to screen mask 13. Measurement start timing may be, for example, when solder P is supplied from syringe 44 and the operation of syringe driving mechanism 45 is stopped. A measurement interval of timer 83 varies according to the state of solder P on screen mask 13. In other words, the hardness of solder P changes due to applied stress and the degree of dryness of solder P while moving in response to the sliding of squeegee 42 is slower than the degree of dryness of solder P while staying on screen mask 13. In addition, as illustrated, in FIGS. 14A and 14B, timer 83 measures time such that measurement interval sa at a time of solder movement is greater than measurement interval sb at a time of no solder movement.

In other words, timer 83 weights measurement interval sa of the time when solder P is moved on screen mask 13 by squeegee 42 such that measurement interval sa is greater than measurement interval sb of the time when solder P does not move on screen mask 13 and measures time. The progressing degree of dryness of the time when solder P is mewed by squeegee 42 is close to zero. Therefore, timer 83 may not measure time for which solder P is moved on screen mask 13 by squeegee 42 by means of weighting.

Here, timer 83 measures time by a number of counts that are counted at a predetermined measurement interval during a measurement of time. In this measuring way, even during the same measurement of time, when the measurement interval is made longer, the number of counts becomes smaller. Thus, the weighted time becomes short.

Namely, by weighting, timer 83 measures time as a time shorter than actually measured time for which solder P is moved on screen mask 13 by squeegee 42.

Further, as another way, by weighting, timer 83 may measure time as a time longer than actually measured time for which solder P does not move on screen mask 13. In this case, the above allowable time is set at the longer time, newly.

Determination unit 84 compares time (measured time) measured by timer 83 with allowable time T1 and determines whether or not the measured time exceeds allowable time T1. When determination unit 84 determines that the measured time exceeds allowable time T1, upper system 3 transmits a signal to printing device M2 via communicator 80. In other words, determination unit 84 determines whether or not solder P supplied to screen mask 13 has exceeded allowable time T1 based on the time measured by tinier 83.

Controller 90 provided in printing device M2 is configured to include communicator 91, storage 92, mechanism driver 93, recognition processor 94, work prohibiting unit 95, and notifier 96. Storage 92 stores printing work data 81a, allowable time data 81d, and the like that are received from upper system 3. Mechanism driver 93 is controlled by controller 90 and drives various types of mechanisms such as bring-in conveyor 14 and the like. Accordingly, squeegee 42 is caused to slide on screen mask 13 to which solder P is supplied and work of printing solder P onto board 4 positioned on the bottom surface of screen mask 13 is executed.

Recognition processor 94 obtains the positional shift amounts of screen mask 13 and board 4 by performing recognition processing on the imaging data of board-side marks 4m and mask-side marks 13m imaged by camera 16. Board holding movement mechanism 12 moves board 4 based on the obtained positional shift amounts and positions board 4 on the bottom surface of screen mask 13. In addition, recognition processor 94 recognizes the identification information of board 4 by performing recognition processing on the imaging data of barcode label 4b imaged by camera 16. Accordingly board 4 brought into printing device M2 is specified.

When determination, unit 84 determines that the measured time, which is time measured by timer 83, exceeds allowable time T1, work prohibiting unit 95 prohibits work in printing device M2 by the signal being received from upper system 3. More specifically, work prohibiting unit 95 commands mechanism driver 93 to perform prohibition of work and mechanism driver 93 received tins command stops the driving of various types of mechanisms. In other words, work prohibiting unit 95 prohibits work for printing solder P onto board 4 in a case where determination unit 84 determines that solder P supplied to screen mask 13 has exceeded allowable time T1.

By the signal being received from upper system 3, notifier 96 lights up signal tower 49 when determination unit 84 determines that the measured time exceeds allowable time T1. Accordingly, worker OP can notice that an abnormality has occurred in printing device M2. In other words, notifier 96 notifies the worker in a case where determination unit 84 determines that solder P supplied to screen mask 13 has exceeded allowable time T1. Notifier 96 may light up signal tower 49 when work prohibiting unit 95 prohibits the work in printing device M2.

Figure 15:
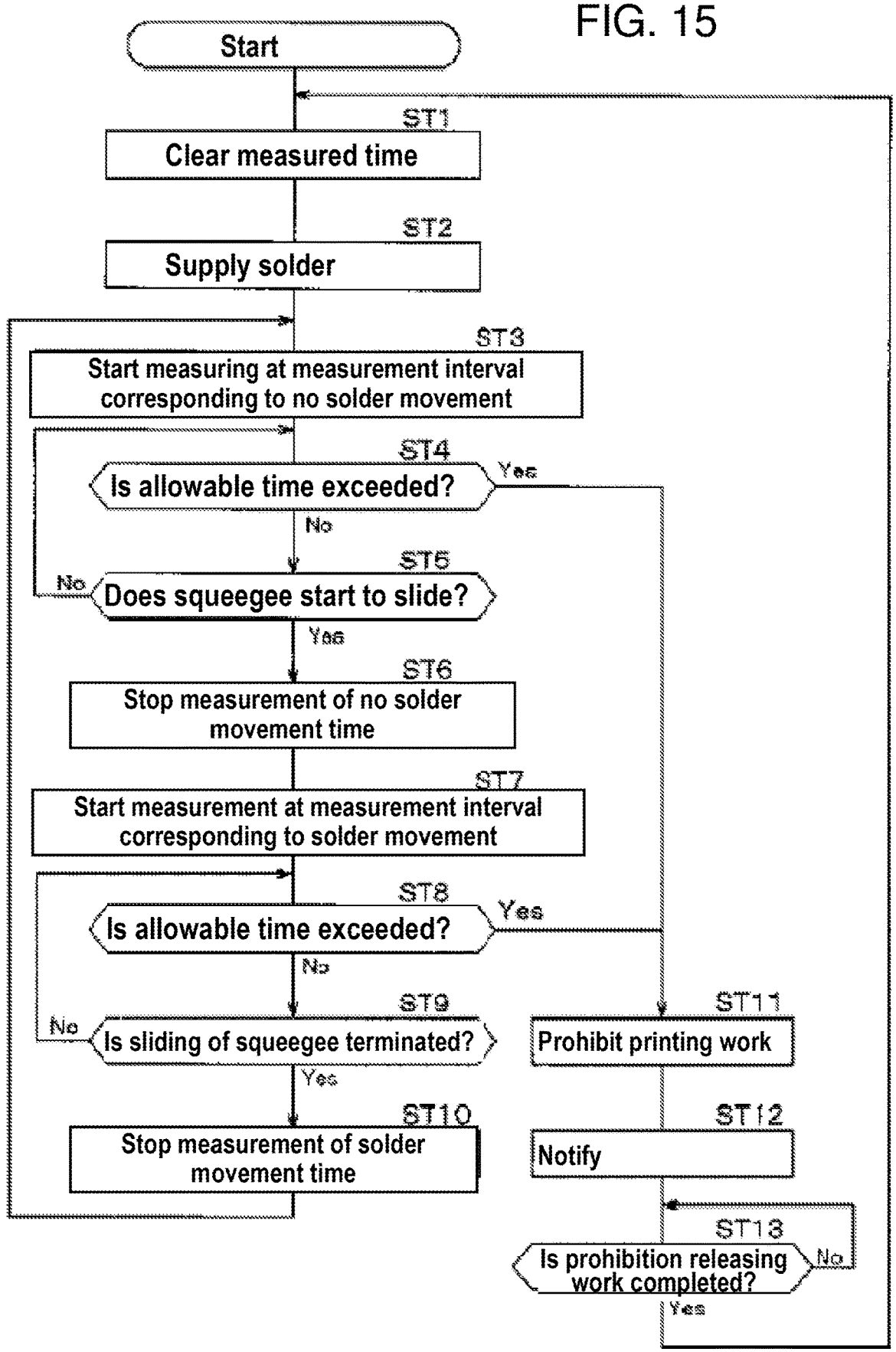
FIG. 15 is a flowchart of a method for managing solder in exemplary embodiment 1 of the invention.

Electronic component mounting system 1 in exemplary embodiment 1 is configured as described before. Next, description will be given of a method for managing solder P with reference to a flowchart of FIG. 15. First, timer 83 clears the measured time, in other words, sets to zero. (ST1: measured time clearance step). Next, syringe 44 supplies solder P to screen mask 13 (ST2: solder supplying step). Next, timer 83 starts measuring time at a measurement interval corresponding to a state where solder P stays on screen mask 13, in other words, at a measurement interval corresponding to no solder movement illustrated in FIG. 14B (ST3: no solder movement time measuring step).

Next, determination unit 84 determines whether or not the time measured by timer 83 exceeds allowable time T1 (ST4: first allowable time excess determining step). In a case where allowable time T1 is not determined to be exceeded ("No" in (ST4)), timer 83 determines whether or not the sliding of squeegee 42 is started (ST5: sliding start or non-start determining step). "The sliding of squeegee 42 is started" means that solder P on screen mask 13 starts moving by being scraped by squeegee 42. In a case where the sliding of squeegee 42 is determined not to be started ("No" in (ST5)), processing returns to (ST4).

On the other hand, in a case where the sliding of squeegee 42 is determined to be started ("Yes" in (ST5)), timer 83 stops measuring time corresponding to the measurement interval of no solder movement time (ST6: no solder movement time measurement, stopping step). Then, timer 83 starts measurement at the measurement interval corresponding to solder movement illustrated in FIG. 14A (ST7: solder movement time measurement starting step). (ST6) and (ST7) configure a measurement, interval switching step in which time measurement intervals are switched by timer 83.

Next, determination unit 84 determines whether or not time measured by timer 83, in other words, total time, which is a total of time measured at the measurement interval corresponding to no solder movement time and time measured at the measurement interval corresponding to solder movement time, exceeds allowable time T1 (ST8: second allowable time determining step).

In a case where allowable time T1 is determined not to be exceeded ("No" in (ST8)), timer 83 determines whether or not the sliding of squeegee 42 is terminated (ST9: sliding termination or non-termination determining step). This determination is made, for example, based on the stop or non-stop of the driving of printing head moving mechanism 17k which is a driving source of moving base 41. In a case where the sliding of squeegee 42 is determined not to he terminated ("No" in (ST9)), processing returns to (ST8). On the other hand, in a case where the sliding of squeegee 42 is determined to be terminated ("Yes" in (ST9)), timer 83 stops measuring time at the measurement interval corresponding to solder movement time (ST10: solder movement time measurement stopping step). Next, returning to (ST3), timer 83 starts measuring time at the measurement interval corresponding to no solder movement. After then, in (ST4), determination unit 84 determines whether or not allowable time T1 is exceeded based on measured time, which is time that has been measured up until now, in other words, the total time measured at the measurement interval corresponding to each of no solder movement time and solder movement time.

In addition, in (ST4) or (ST8), in a case where the measured time, which is time measured by timer 83, is determined to exceed, allowable time T1 ("Yes" in (ST4) or (ST8)), upper system 3 transmits a signal to printing device M2 and work prohibiting unit 95 prohibits the work in printing device M2 (ST11: work prohibiting step). Next, notifier 96 lights up signal tower 49 to notify worker OP (ST12: notifying step).

Next, work prohibiting unit 95 determines whether or not prohibition releasing work, which is for releasing the prohibition of work, is completed (ST13: prohibition releasing work completion determining step). In other words, worker OP who received notification performs work of removing solder P on screen mask 13, which is a part of prohibition releasing work. In addition, in a case where the amount of solder P saved in container 44a of syringe 44 is equal to or smaller than a certain amount, worker OP performs work of replacing container 44a with a new container 44a. At this time, worker OP causes the reading surface of barcode reader 47 to look barcode label 46 attached to container 44a. Accordingly, barcode reader 47 reads barcode label 46 and transmits the read barcode label to printing device M2. Controller 90 of printing device M2 recognizes the identification information of container 44a that has newly replaced the existing container based on transmitted barcode label 46. Barcode reader 47 and controller 90 configure a recognizer that recognizes the identification information.

Work prohibiting unit 95 receives the fact that identification information is recognized and determines that the prohibition releasing work is completed ("Yes" in (ST13)), thereby releasing the prohibition of the work in printing device M2. In other words, work prohibiting unit 95 prohibits the work until the recognizer recognizes the identification information. In a case where work of replacing container 44a is not necessary since the amount of solder P saved in container 44a is sufficient, worker OP inputs the tact that the prohibition releasing work is completed with aid of a touch panel (not illustrated), which is an operational input unit, after removing solder P on screen mask 13, which has exceeded allowable time T1. In a case where the prohibition releasing work is determined to he completed in (ST13), processing returns to (ST1).

As described hereinbefore, according to printing device M2 in exemplary embodiment 1, solder P can be more accurately managed and thus the generation of a defective board can be prevented in advance since time is measured by the measurement interval of the time for which solder P is moved on screen mask 13 by squeegee 42 being weighted so as to be greater than the measurement interval of the time for which solder P does not move on screen, mask 13. In exemplary embodiment 1, upper system 3 provided with solder manager 82 and printing device M2 configure a solder management system.

Printing device M2 and the solder management system in exemplary embodiment 1 are not limited to configurations described hereinbefore and can be appropriately altered in terms of design without departing from the spirit of the invention. For example, work prohibiting unit 95 may prohibit work in a case where determination unit 84 has determined whether or not the measured time, which is time measured by timer 83, exceeds allowable time T2 and the measured time is determined to exceed allowable time T2. In addition, solder manager 82 may be incorporated into printing device M2 or work prohibiting unit 95 and notifier 96 may be incorporated into upper system 3. Furthermore, barcode reader 47 may transmit the read barcode label 46 to upper system 3.

(Exemplary Embodiment 2)

Next, description will be given of exemplary embodiment 2 of the invention. Exemplary embodiment 2 is different from exemplary embodiment 1 in that solder P (solder portion Pa formed on electrode 4d) that is printed on board 4 transported to the mount devices, including printing inspection device M3 and electronic component placing devices M4 to M6, is also managed. First, description will be given of a configuration of a control system with reference to FIG. 16. Description of a configuration, which is the same as that of exemplary embodiment 1, will not be repeated.

In FIG. 16, solder manager 82A provided in upper system 3A is configured to include timer 83A, determination unit 84A, and estimated time calculator 85. Timer 83A measures time it takes for solder P to be printed onto board 4 after solder P is supplied onto screen mask 13 and time after solder P is printed onto board 4 by printing device M2. As described in exemplary embodiment 1, the time it takes for solder P to be printed onto board 4 after solder P is supplied onto screen mask 13 is measured by timer 83A based on the measurement intervals corresponding to each of solder movement time and no solder movement time. In other words, the time it takes for solder P to be printed onto board 4 after solder P is supplied onto screen mask 13 is total time, which is a total of time for which solder P is moved on screen mask 13 by squeegee 42 and time for which solder P does not move on screen mask 13. In addition, timer 83A measures time by weighting the measurement interval of the time for which solder P is moved on screen mask 13 by squeegee 42 so as to be smaller than the measurement interval of the time for which solder P does not move on screen mask 13.

Measurement start timing after solder P is printed onto board 4, for example, may be set to a time point when the sliding of squeegee 42 for printing solder P onto board 4 is terminated. Time measurement by timer 83A is performed for each board 4 and is terminated when board 4 is brought into a position at which the management of solder P is unnecessary, in other words, into the melting zone of reflow device M7 or at a time point when determination unit 84A, which will be described later, determines that solder P on board 4 has exceeded allowable time T2.

Determination unit 84A determines whether or not solder P printed on board 4 has exceeded allowable time T2 based on the time measured by timer 83. As described before, allowable time T2 refers to time that can be allowed for solder P to be exposed to the air until solder P melts in reflow device M7 in a state of being printed on board 4 after solder P is supplied to screen mask 13.

Examples will be given of two specific determination methods for determination unit 84A. The first, example is a method in which it is determined that whether or not time measured by timer 83A exceeds allowable time T2. For example, in a ease where measured time te, which is time measured by timer 83A, exceeds allowable time T2 at a time point when board 4 is brought into electronic component placing device M4, solder P printed on board 4 comes into a state in which board 4 cannot be used. Therefore, it is inevitable that this board 4 will be discarded as a defective board even if electronic component 5 is placed. Meanwhile, waste of electronic component 5 is prevented by prohibiting work with respect to board 4 on which solder P is printed once time (elapsed time) after solder P is supplied to screen mask 13 is measured and allowable time T2 is exceeded at a predetermined time point when board 4 is transported to the mount device. In other words, in the first example, determination unit 84A determines whether or not total time, a total of time it takes for solder P to be printed onto board 4 after solder P is supplied onto screen mask 13 and time (elapsed time) after solder P is printed onto board 4, exceeds allowable time T2.

Figure 17A:
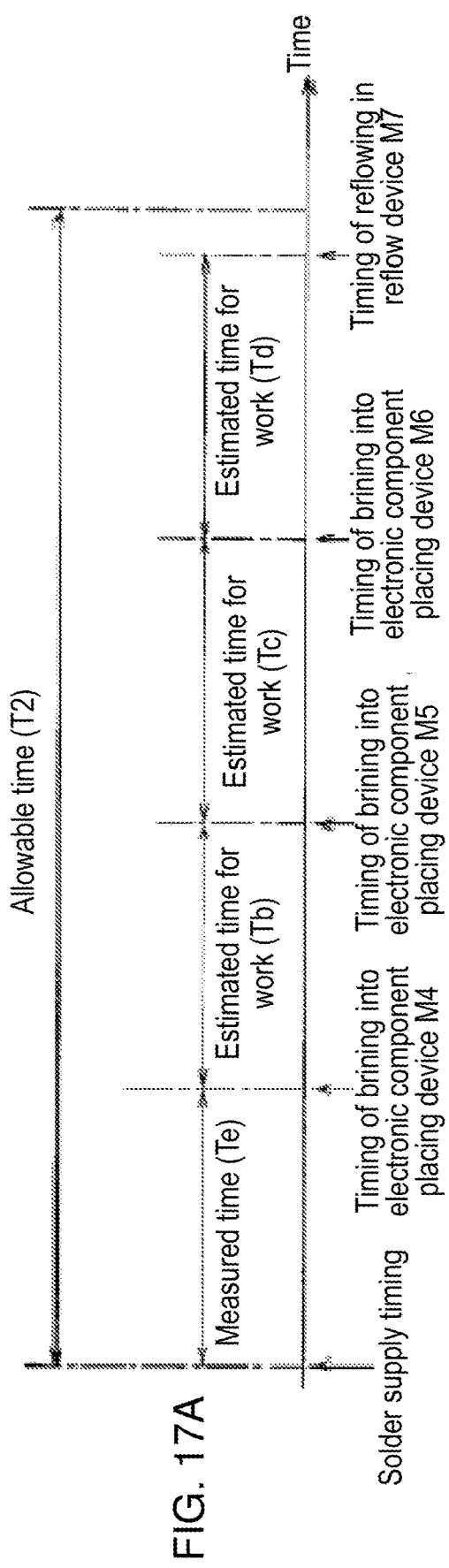
FIGS. 17A and 17B are explanatory diagrams of time (allowable time) for which use of solder can be allowed in exemplary embodiment 2 of the invention.

The second example is a method in which estimated time, which is time estimated to be required for board 4 to be reflowed in reflow device M7 from a predetermined time point when board 4 is transported to the mount device, is taken into account. Description will be given of time point when board 4 is brought into electronic component placing device M4 as an example with reference to FIGS. 17A and 17B. FIG. 17A illustrates a case where total time, which is a total of measured time te until solder P is brought into electronic component placing device M4 after solder P is supplied to screen mask 13 in a state of being printed on board 4 and the pieces of estimated time tb, tc, and td, which are the pieces of time estimated to be required for board 4 to be reflowed in reflow device M7 after board 4 is brought into electronic component placing device M4 is within a range of allowable time T2. In general, board 4 is transported to the plurality of mount devices such that printed solder P melts within allowable lime T2.

Estimated time calculator 85 calculates estimated time, which is time estimated to be required tor board 4 to be reflowed in reflow device M7 from a predetermined time point when board 4 is brought into electronic component placing device M4. In an example illustrated in FIG. 17A, estimated time, which is time estimated to be required for board 4 to be reflowed in reflow device M7 after board 4 is brought into electronic component placing device M4, is obtained by totaling up the pieces of estimated time tb, te, and td of electronic component placing devices M4 to M6. In other words, estimated time calculator 85 calculates estimated time, which is time estimated to be required for board 4 to reach the position (herein, the melting zone of reflow device M7) at which the management of solder P is unnecessary from a predetermined time point when board 4 on which solder P is printed is transported to the mount device.

Figure 17B:
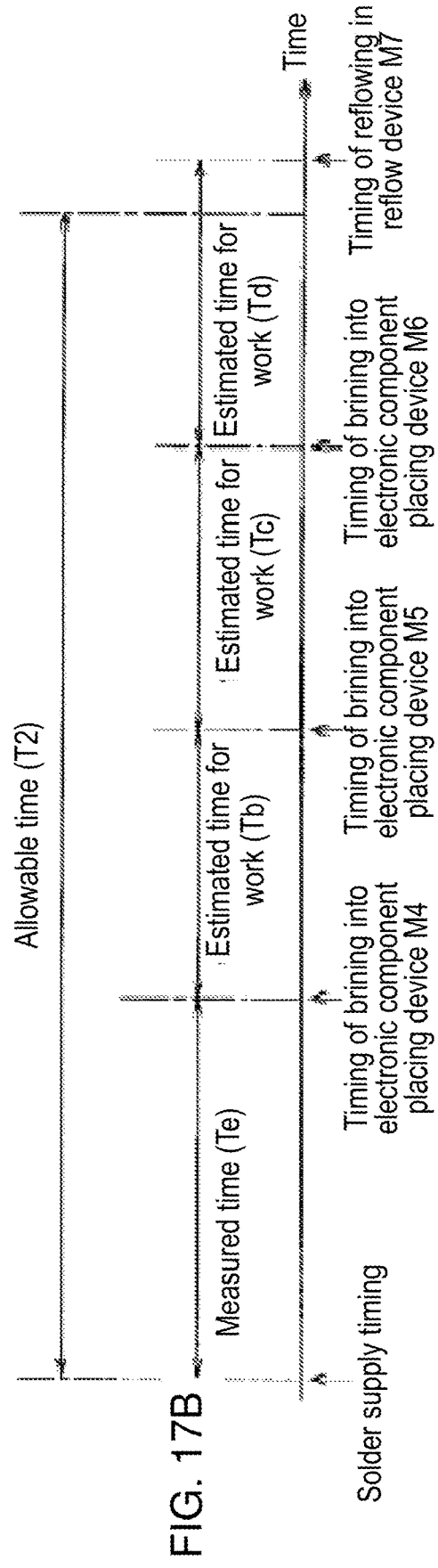

In FIG. 17B, a case where total time, which is a total of measured time te and pieces of estimated time tb, te, and td, which are the pieces of time estimated to be required for board 4 to be reflowed in reflow device M7 after board 4 is brought into electronic component placing device M4, exceeds allowable time T2. In this case, time required for solder P on board 4 to melt after being supplied to screen mask 13 exceeds allowable time T2. Therefore, even if work is executed on board 4, on which solder P is printed, in electronic component placing devices M4 to M6, it only causes waste of electronic component 5. Therefore, determination unit 84A determines whether or not total time, which is a total of time it takes for solder P to be printed onto board 4 after solder P is supplied onto screen mask 13, time until a predetermined time point when the board is transported to the mount device after solder P is printed on board, and estimated time, which is time estimated to be required for the board to reach the position (herein, the melting zone in reflow device M7) where the management of solder P is unnecessary from the predetermined time point, exceeds allowable time T2. In addition, once the total time is determined to exceed allowable time T2, work with respect to board 4 in the mount device is prohibited. Accordingly, the generation of the defective board can be predicted at an early stage and waste of electronic component 5 can be prevented.

Controller 100 provided in printing inspection device M3 is configured to include communicator 101, storage 102, mechanism driver 103, inspection processor 104, work prohibiting unit 105, and notifier 106. Storage 102 stores inspection work data 81*b* and allowable time data 81*d* received from upper system 3. Mechanism driver 103 is controlled by controller 100 and moves inspection camera 55 above board 4 by driving a camera driving mechanism.

Inspection processor 104 performs recognition processing on imaging data acquired by imaging performed by inspection camera 55 and recognizes solder portion Pa. In addition, inspection processor 104 inspects the state of solder portion Pa based on recognition processing results. In a case where the elapsed time of solder P printed on board 4 is determined to exceed allowable time T2, work prohibiting unit 105 prohibits work in printing inspection device M3 by the signal being received from upper system 3.

Once inspection processor 104 determines that solder portion Pa is in a defective state, notifier 106 controls and lights up signal tower 107 (FIG. 1) provided in printing inspection device M3 to notify worker OP. In addition, in a case where determination unit 84A determines that solder P printed on board 4 has exceeded allowable time T2, notifier 106 controls and lights up signal tower 107 to notify the worker by the signal being received from upper system 3.

Controller 110 provided in electronic component placing devices M4 to M6 is configured to include communicator 111, storage 112, mechanism driver 113, recognition processor 114, work prohibiting unit 115, and notifier 116. Storage 112 stores placing work data 81*c* and allowable time data 81*d* received from upper system 3. Mechanism driver 113 is controlled by controller 110 and moves various types of mechanisms such as Y-axis beam 67. Accordingly, work of placing electronic component 5 onto board 4 is executed.

Recognition processor 114 obtains positional shift amounts of board 4 and electronic component 5 by performing recognition processing on imaging data acquired by board recognition camera 71 and imaging data acquired by component recognition camera 72. The placing position of electronic component 5 is corrected based on the positional shift amounts.

By the signal being received from upper system 3, work prohibiting unit 115 prohibits work in electronic component placing devices M4 to M6 into which board 4 is brought in a case where the elapsed time of solder P printed on board 4 is determined to exceed allowable time T2. More specifically, work prohibiting unit 115 commands mechanism driver 113 to perform prohibition of work and mechanism driver 113 which received this command stops the driving of various types of mechanisms. In other words, work prohibiting unit 115 prohibits work for mounting electronic component 5 onto the board, on which solder P that has exceeded allowable time T2 with respect to the mount device is printed, in a case where determination unit 84A determines that solder P printed on board 4 has exceeded allowable time T2. The same applies to work prohibiting unit 105 of printing inspection device M3.

In a case where determination unit 84A determines that, solder P printed on board 4 exceeds allowable time T2, notifier 116 controls and lights up signal tower 74 to notify the worker by the signal being received from upper system 3. In other words, notifier 116 notifies the worker in a case where determination unit 84A determines that solder P printed on board 4 has exceeded allowable time T2. The same applies to notifier 106 of printing inspection device M3.

Figure 18:
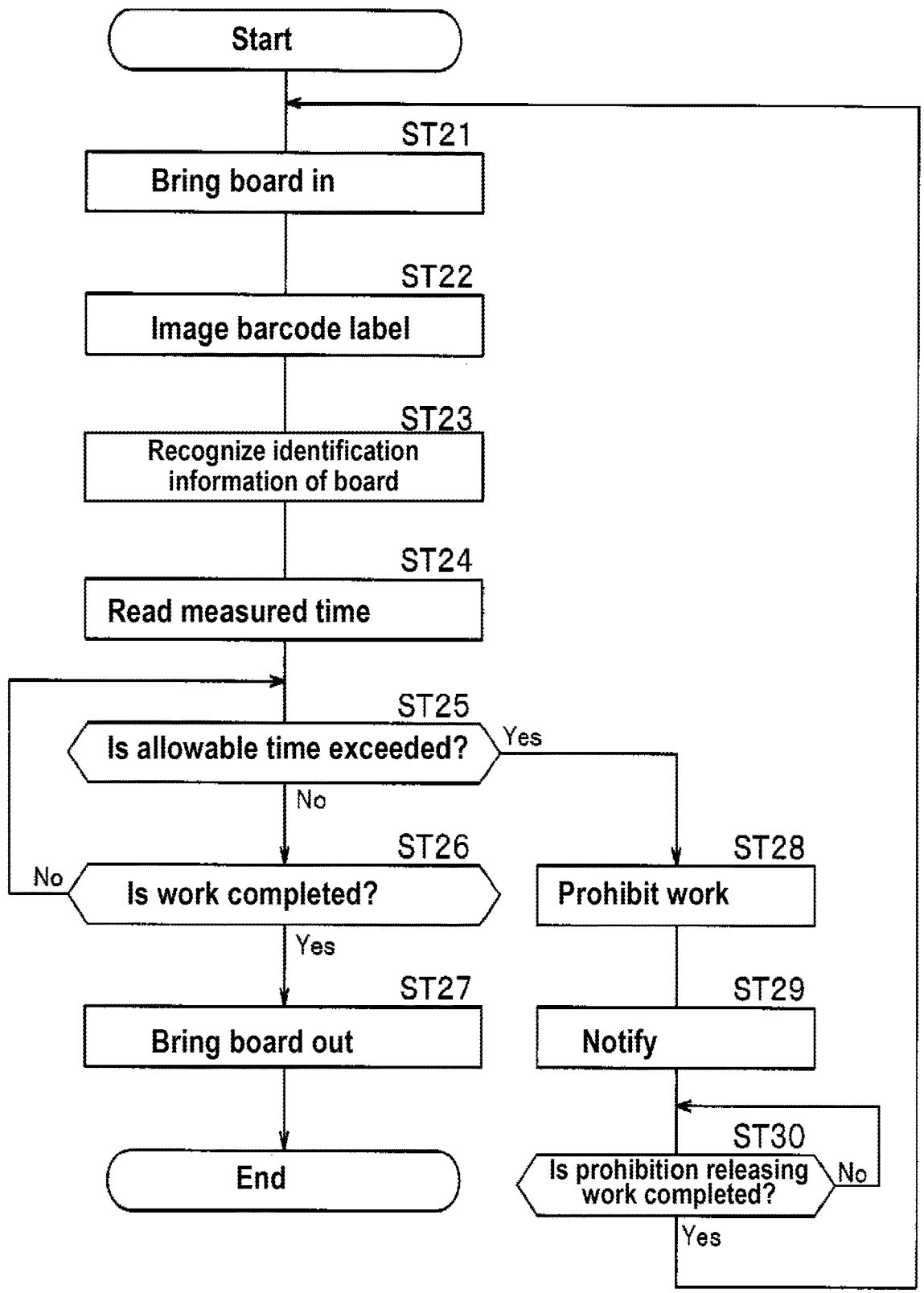
FIG. 18 is a flowchart of a method for managing solder in exemplary embodiment 2 of the invention.

Next, description will be given of a method for managing solder P in exemplary embodiment 2 with reference to FIG. 18. Herein, electronic component placing devices M4 to M6 will be given as examples of the mount devices and description will be given of a case where determination unit 84A determines with the first determination method. First, board transport mechanism 61 brings board 4 into the device (ST21: board bringing-in step). Next, board recognition camera 71 images barcode label 4b of board 4 that is brought in (ST22: imaging step). Next, recognition processor 114 performs recognition processing on barcode label 4b and recognizes the identification information of board 4 (ST23: identification information recognizing step). The recognized identification information is sent to upper system 3A. Next, determination unit 84A reads the measured time, which is time measured by timer 83A, having solder P printed on board 4 corresponding to the identification information as a target (ST24: measured time reading step). Herein, the read measured time is elapsed time until a predetermined time point when solder P, in a state of being printed on board 4, is brought into electronic component placing device M4 after solder P is supplied to screen mask 13.

Next, determination unit 84A determines whether or not the read measured time exceeds allowable time T2 (ST25: allowable time excess determining step). In a case where allowable time T2 is determined not to be exceeded ("No" in (ST25)), solder manager 82A determines whether or not predetermined work in electronic component placing device M4 is completed (ST26: work completion determining step). Once the work is determined to be completed ("Yes" in (ST26)), board transport mechanism 61 brings board 4 out to downstream electronic component placing device M5 (ST27: board bringing-out step). In addition, once the work is determined not to be completed ("No" in (ST26)), processing returns to (ST25).

In a case where allowable time T2 is determined to be exceeded in (ST25) ("Yes" in (ST25)), work prohibiting unit 115 prohibits work with respect to board 4 in electronic component placing device M4 (ST28: work prohibiting step). At this time, in a case where subsequent board 4 is being brought into printing inspection device M3 disposed on the upstream side of electronic component placing device M4, into which board 4 that undergoes the prohibition of work is brought, work prohibiting unit 105 may prohibit the work with respect to the following board 4. In other words, in a case where determination unit 84A determines that solder P on board 4 brought into one mount device out of the plurality of mount devices has exceeded allowable time T2, the work prohibiting unit prohibits work in the mount device disposed on the upstream side of the mount device into which this board 4 is brought. Accordingly, a situation, in which defective boards are consecutively generated, can be prevented.

Next, notifier 116 controls and lights up signal tower 74 to notify worker OP (ST29: notifying step). Next, work prohibiting unit 115 determines whether or not the prohibition releasing work is performed (ST30: prohibition releasing work determining step). In other words, worker OP picks up board 4 that undergoes the prohibition of work from the mount device. After board 4 is picked up, worker OP inputs the fact that the prohibition releasing work is completed with aid of an operational input unit (not illustrated) such as a touch panel. Once the prohibition releasing work is determined to be performed ("Yes" in ST30), processing returns to (ST21).

Figure 19:
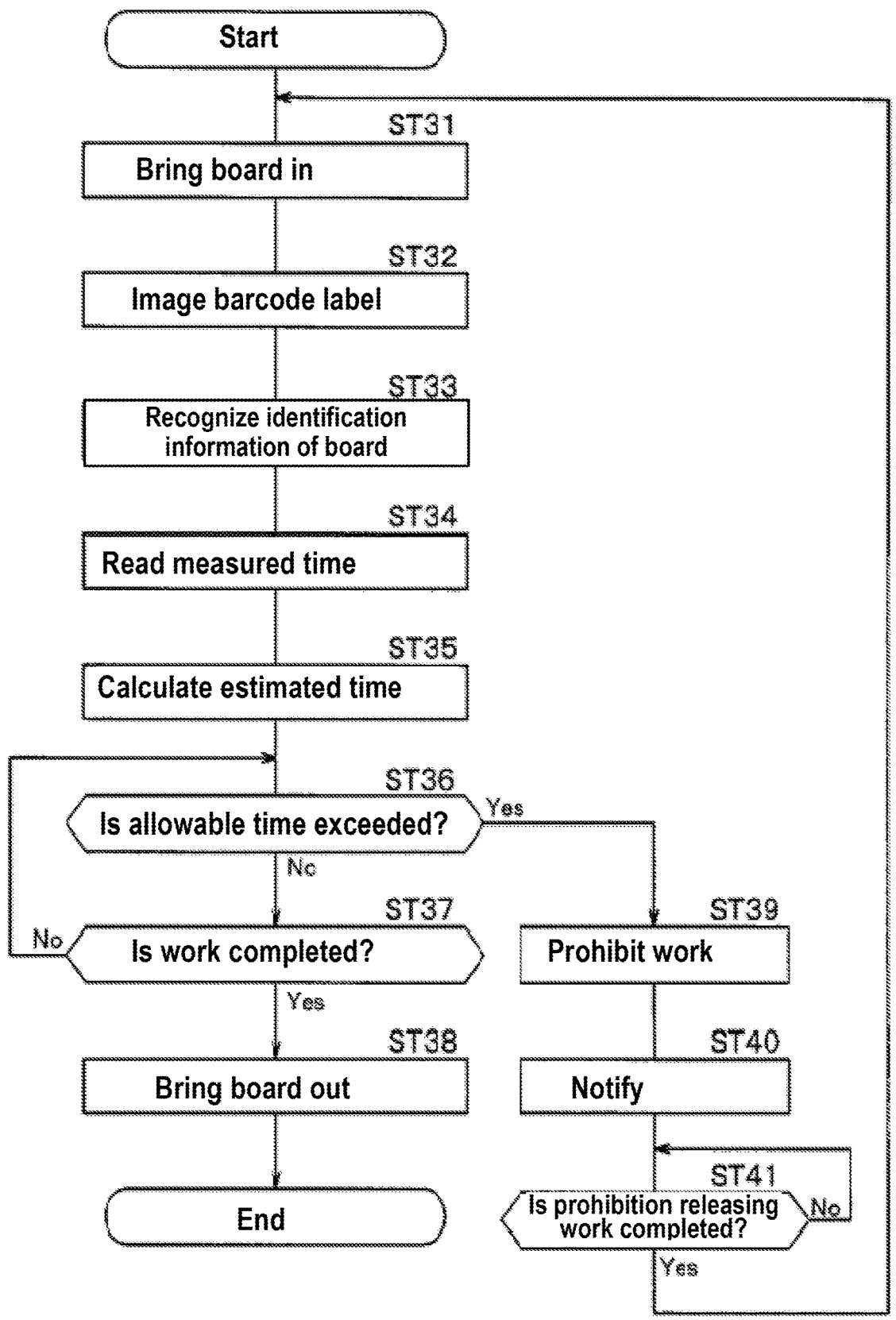
FIG. 19 is a flowchart of the method for managing the solder in exemplary embodiment 2 of the invention.

Next, description will be given of the method for managing solder P in a case where determination unit 84A determines with the second determination method with reference to FIG. 19. Description will not be repeated for steps that are the same as the steps illustrated in FIG. 18. In this example, the following steps are added to a measured time reading step of (ST34). In other words, estimated time calculator 85 calculates estimated time, which is time estimated to be required for board 4 to be brought into the melting zone of reflow device M from a predetermined time point when board 4 is brought into electronic component placing device M4 (ST35: estimated time calculating step). Next, determination unit 84A determines whether or not total time, which is a total of elapsed time (measured time, which is time measured by timer 83A) after solder P is supplied to screen mask 13 and the estimated time, exceeds allowable time T2 (ST36: allowable time excess determining step).

As described hereinbefore, according to exemplary embodiment 2, solder P, which is on board 4 transported to each of the mount devices, can be more accurately managed and the generation of the detective board can be prevented. The electronic component mounting system in exemplary embodiment 2 is not limited to the configuration described hereinbefore and can be appropriately altered in terms of design without departing from the spirit of the invention. For example, solder manager 82A may be incorporated into printing device M2 and electronic component placing devices M4 to M6 or work prohibiting units 105 and 115 and notifiers 106 and 116 may be incorporated into upper system 3.

The printing device and the solder management system of the invention are useful in the field of electronic component mounting since the solder can be more accurately managed and the generation of the defective board can be prevented.

What is claimed is:

1. A printing device that prints solder of paste onto a board by causing a squeegee to slide with respect to a screen mask to which the solder is supplied, comprising:

a storage that stores allowable time for which use of the solder supplied to the screen mask can be allowed;

a timer that measures time for which the solder is supplied to the screen mask;

a determination unit that determines whether or not use of the solder supplied to the screen mask has exceeded the allowable time, based on the time measured by the timer; and a notifier that notifies a worker in a case where the determination unit determines that the use of the solder supplied to the screen mask has exceeded the allowable time, wherein a measurement interval of the timer varies according to a state of the solder on the screen mask.

2. The printing device of claim 1, wherein the measurement interval is decreased when the solder is moved on the screen mask by the squeegee.

3. The printing device of claim 1, wherein the timer measures time by a number of counts that are counted at a predetermined measurement interval, and the measurement interval is increased when the solder is not moved on the screen mask by the squeegee.

4. The printing device of claim 1, further comprising:

a work prohibiting unit that prohibits work of printing the solder onto the board in a case where the determination unit determines that the use of the solder supplied to the screen mask has exceeded the allowable time.

5. The printing device of claim 4, further comprising:

a solder storage unit that stores the solder before being supplied to the screen mask;

identification information that is attached to the solder storage unit; and a recognizer that recognizes the identification information, wherein the work prohibiting unit prohibits work until the recognizer recognizes the identification information.

6. A solder management system including a printing device that prints solder of paste onto a board by causing a squeegee to slide with respect to a screen mask to which the solder is supplied, comprising:

a storage that stores allowable time for which use of the solder supplied to the screen mask can be allowed;

a timer that measures time for which the solder is supplied to the screen mask;

a determination unit that determines whether or not use of the solder supplied to the screen mask has exceeded the allowable time, based on the time measured by the timer; and a notifier that notifies a worker in a case where the determination unit determines that the use of the solder supplied to the screen mask has exceeded the allowable time, wherein a measurement interval is varied depending on whether the solder is moved or not moved on the screen mask by the squeegee or.

7. The solder management system of claim 6, wherein the measurement interval is decreased when the solder is moved on the screen mask by the squeegee.

8. The solder management system of claim 6, wherein the timer measures time by a number of counts that are counted at a predetermined measurement interval, and the measurement interval is increased when the solder is not moved on the screen mask by the squeegee.

9. The solder management system of claim 6, further comprising:

a work prohibiting unit that prohibits work of printing the solder onto the board in a case where the determination unit determines that the use the solder supplied to the screen mask has exceeded the allowable time.

10. The solder management system of claim 9, further comprising:

a solder storage unit that stores the solder before being supplied to the screen mask;

identification information that is attached to the solder storage unit; and a recognizer that recognizes the identification information, wherein the work prohibiting unit prohibits work until the recognizer recognizes the identification information.

11. A printing managing method used in a printing device that prints solder of paste onto a board by causing a squeegee to slide with respect to a screen mask to which the solder is supplied, and has a storage that stores allowable time for which use of the solder supplied to the screen mask can be allowed, the printing managing method comprising:

measuring time for which solder is supplied to the screen mask with a timer, wherein a measurement interval is varied based on whether the solder is moved on the screen mask by the squeegee or whether the solder is not moved on the screen mask;

determining, with a determination unit, whether or not use of the solder supplied to the screen mask has exceeded the allowable time, based on the time measured by the timer; and notifying, with a notifier, a worker in a case where the determination unit determines that the use of the solder supplied to the screen mask has exceeded the allowable time.

12. The printing managing method of claim 11, further comprising:

prohibiting work of printing the solder onto the board in a case where the determination is made that the use of the solder supplied to the screen mask has exceeded the allowable time in the determining.

13. The printing managing method of claim 11, wherein the measurement interval is decreased when the solder is moved on the screen mask by the squeegee.

14. The solder management system of claim 11, wherein in the measuring, the timer measures time by a number of counts that are counted at a predetermined measurement interval during a measurement of time, and the measurement interval is increased when the solder is moved on the screen mask by the squeegee.

* * * * *